(12) United States Patent
Wu et al.

(10) Patent No.: US 11,004,773 B2
(45) Date of Patent: May 11, 2021

(54) POROUS BARRIER LAYER FOR IMPROVING RELIABILITY OF THROUGH-SUBSTRATE VIA STRUCTURES AND METHODS OF FORMING THE SAME

(71) Applicant: SANDISK TECHNOLOGIES LLC, Addison, TX (US)

(72) Inventors: Chen Wu, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/391,632

(22) Filed: Apr. 23, 2019

(65) Prior Publication Data

US 2020/0343161 A1    Oct. 29, 2020

(51) Int. Cl.
*H01L 23/48* (2006.01)
*H01L 23/528* (2006.01)
(Continued)

(52) U.S. Cl.
CPC ...... *H01L 23/481* (2013.01); *H01L 21/02203* (2013.01); *H01L 21/31111* (2013.01);
(Continued)

(58) Field of Classification Search
CPC .............. H01L 23/481; H01L 23/528; H01L 23/53257; H01L 23/5329; H01L 24/05;
(Continued)

(56) References Cited

U.S. PATENT DOCUMENTS 5,915,167 A    6/1999 Leedy
9,023,688 B1 *  5/2015 Or-Bach ............. H01L 23/3677
                                                    438/122
(Continued)

FOREIGN PATENT DOCUMENTS

CN       101241861 B     8/2008

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Alexander O Williams
(74) *Attorney, Agent, or Firm* — The Marbury Law Group PLLC

(57) ABSTRACT

First semiconductor devices, a first dielectric material layer, a porous dielectric material layer, and a metal interconnect structure formed within a second dielectric material layer are formed on a front-side surface of a first semiconductor substrate. A via cavity extending through the first semiconductor substrate and the first dielectric material layer are formed. The via cavity stops on the porous dielectric material layer. A continuous network of pores that are free of any solid material therein continuously extends from a bottom of the via cavity to a surface of the metal interconnect structure. A through-substrate via structure is formed in the via cavity. The through-substrate via structure includes a porous metallic material portion filling the continuous network of pores and contacting surface portions of the metal interconnect structure. Etch damage to the first semiconductor devices and metallic particle generation may be minimized by using the porous metallic material portion.

14 Claims, 21 Drawing Sheets

(51) Int. Cl.

| | | |
|---|---|---|
| *H01L 23/532* | (2006.01) | |
| *H01L 23/00* | (2006.01) | |
| *H01L 25/18* | (2006.01) | |
| *H01L 21/02* | (2006.01) | |
| *H01L 21/768* | (2006.01) | |
| *H01L 21/311* | (2006.01) | |
| *H01L 25/00* | (2006.01) | |
| *H01L 27/11556* | (2017.01) | |
| *H01L 27/11521* | (2017.01) | |
| *H01L 27/11526* | (2017.01) | |
| *H01L 27/11568* | (2017.01) | |
| *H01L 27/11573* | (2017.01) | |
| *H01L 27/11582* | (2017.01) | |
| *H01L 23/522* | (2006.01) | |
| *H01L 21/321* | (2006.01) | |
| *H01L 21/3105* | (2006.01) | |

(52) U.S. Cl.
CPC .. *H01L 21/31144* (2013.01); *H01L 21/76802* (2013.01); *H01L 21/76877* (2013.01); *H01L 21/76898* (2013.01); *H01L 23/528* (2013.01); *H01L 23/5226* (2013.01); *H01L 23/5329* (2013.01); *H01L 23/53257* (2013.01); *H01L 24/05* (2013.01); *H01L 24/08* (2013.01); *H01L 24/48* (2013.01); *H01L 24/89* (2013.01); *H01L 25/18* (2013.01); *H01L 25/50* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01); *H01L 21/31053* (2013.01); *H01L 21/3212* (2013.01); *H01L 21/7684* (2013.01); *H01L 21/76819* (2013.01); *H01L 2224/04042* (2013.01); *H01L 2224/0557* (2013.01); *H01L 2224/08145* (2013.01); *H01L 2224/48463* (2013.01); *H01L 2224/80001* (2013.01); *H01L 2924/1438* (2013.01)

(58) Field of Classification Search
CPC ... H01L 24/48; H01L 25/18; H01L 21/02203; H01L 21/76802; H01L 21/76898; H01L 21/76877; H01L 21/3111; H01L 21/31144; H01L 25/50; H01L 27/11556; H01L 27/27; H01L 27/11521; H01L 27/11526; H01L 27/11568; H01L 27/11573; H01L 27/11582; H01L 24/08; H01L 24/89; H01L 23/5226; H01L 21/3212; H01L 2224/0557; H01L 2224/04042; H01L 2224/48463; H01L 2924/1438; H01L 2224/08145; H01L 2224/80001; H01L 21/76819; H01L 21/7684; H01L 21/31053; H01L 23/48; H01L 23/532; H01L 23/00; H01L 21/02; H01L 21/768; H01L 21/311; H01L 27/22526; H01L 1115/82; H01L 23/522; H01L 21/321; H01L 21/3105
USPC .................................................. 257/738, 737
See application file for complete search history.

(56) References Cited

U.S. PATENT DOCUMENTS

| | | | |
|---|---|---|---|
| 9,312,224 B1* | 4/2016 | Canaperi | H01L 23/53238 |
| 9,640,531 B1* | 5/2017 | Or-Bach | H01L 21/76816 |
| 9,847,276 B2* | 12/2017 | Kang | H01L 23/481 |
| 9,917,093 B2 | 3/2018 | Chu et al. | |
| 10,103,161 B2 | 10/2018 | Ito et al. | |
| 10,115,681 B1 | 10/2018 | Ariyoshi | |
| 2008/0136042 A1 | 6/2008 | Park | |
| 2008/0136043 A1* | 6/2008 | Ohtake | H01L 23/528 257/774 |
| 2008/0272493 A1 | 11/2008 | Ko et al. | |
| 2009/0014887 A1* | 1/2009 | Ohtake | H01L 21/76808 257/774 |
| 2011/0254165 A1* | 10/2011 | Muranaka | H01L 21/76898 257/751 |
| 2011/0298133 A1* | 12/2011 | Oka | H01L 24/05 257/751 |
| 2012/0025392 A1* | 2/2012 | Streck | H01L 21/76829 257/773 |
| 2013/0285203 A1* | 10/2013 | Hiroi | H01L 23/5329 257/532 |
| 2016/0035702 A1* | 2/2016 | Luo | H01L 21/28518 257/754 |
| 2017/0011956 A1* | 1/2017 | De Wolf | H01L 21/76826 |
| 2017/0062284 A1* | 3/2017 | Mason | H01L 21/7624 |
| 2017/0162430 A1* | 6/2017 | Dai | H01L 21/76802 |
| 2017/0373078 A1 | 12/2017 | Chu et al. | |
| 2017/0373087 A1 | 12/2017 | Ito et al. | |
| 2018/0254247 A1* | 9/2018 | Kim | H01L 27/11531 |
| 2018/0277632 A1* | 9/2018 | Fanelli | H01L 23/3114 |
| 2019/0035681 A1 | 1/2019 | Kuang et al. | |
| 2019/0057959 A1* | 2/2019 | Or-Bach | H01L 27/14634 |
| 2019/0103378 A1* | 4/2019 | Escher-Poeppel | H01L 24/81 |
| 2019/0115258 A1* | 4/2019 | Tsai | H01L 21/76877 |
| 2019/0172826 A1* | 6/2019 | Or-Bach | H01L 27/0688 |
| 2020/0243487 A1* | 7/2020 | Or-Bach | H01L 24/80 |

OTHER PUBLICATIONS

Huylenbroeck, S.V. et al., "A Highly Reliable 1x5µm Via-last TSV Module," 2018 IEEE International Interconnect Technology Conference (IITC), Santa Clara, CA, pp. 94-96, (2018).

Pedreira, O. V. et al., "Reliability Study on Cobalt and Ruthenium as Alternative Metals for Advanced Interconnects," 2017 International Reliability Physics Symposium (IRPS) proceedings, pp. 6B-2.1 to 6B-2.8, (2017).

Sun, J.N. et al., "Probing diffusion barrier integrity on porous silica low-k thin films using positron annihilation lifetime spectroscopy," Journal of Applied Physics, vol. 89, No. 9, pp. 5138-5144, doi: 10.1063/1.1360704, (2001).

Wu, C. et al., "Electrical Reliability Challenges of Advanced Low-k Dielectrics," *ECS Journal of Solid State Science and Technology*, vol. 4, No. 1, pp. N3065-N3070 (2015).

Wu, C. et al., "New Breakdown Mechanism Investigation: Barrier Metal Penetration Induced Soft Breakdown in Low-k Dielectrics" 2016 International Reliability Physics Symposium (IRPS) proceedings, pp. 3A-2-1 to 3A-2-6, (2016).

U.S. Appl. No. 15/873,101, filed Jan. 17, 2018, SanDisk Technologies LLC.

U.S. Appl. No. 15/892,648, filed Feb. 9, 2018, SanDisk Technologies LLC.

U.S. Appl. No. 15/928,340, filed Mar. 22, 2018, SanDisk Technologies LLC.

U.S. Appl. No. 15/928,407, filed Mar. 22, 2018, SanDisk Technologies LLC.

U.S. Appl. No. 15/960,267, filed Apr. 23, 2018, SanDisk Technologies LLC.

U.S. Appl. No. 15/979,885, filed May 15, 2018, SanDisk Technologies LLC.

U.S. Appl. No. 16/231,752, filed Dec. 24, 2018, SanDisk Technologies LLC.

U.S. Appl. No. 16/242,216, filed Jan. 8, 2019, SanDisk Technologies LLC.

U.S. Appl. No. 16/243,469, filed Jan. 9, 2019, SanDisk Technologies LLC.

U.S. Appl. No. 16/248,923, filed Jan. 16, 2019, SanDisk Technologies LLC.

U.S. Appl. No. 16/249,423, filed Jan. 16, 2019, SanDisk Technologies LLC.

(56) References Cited

OTHER PUBLICATIONS

U.S. Appl. No. 16/255,413, filed Jan. 23, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
Notification of Transmittal of the International Search Report and Written Opinion of the International Search Authority for International Patent Application No. PCT/US2019/068872, dated Apr. 16, 2020, 12 pages.
Mohan, K. et al., "A Review of Nanoporous Metals in Interconnects," JOM, vol. 70, No. 10, pp. 2192-2204 (2018). https://doi.org/10.1007/s11837-018-3081-z.
Ali, R., et al. "Modeling and simulation of Cu diffusion and drift in porous CMOS backend dielectrics," APL Materials, Vo. 6, 066101, (2018). https://doi.org/10.1063/1.5021032.

* cited by examiner

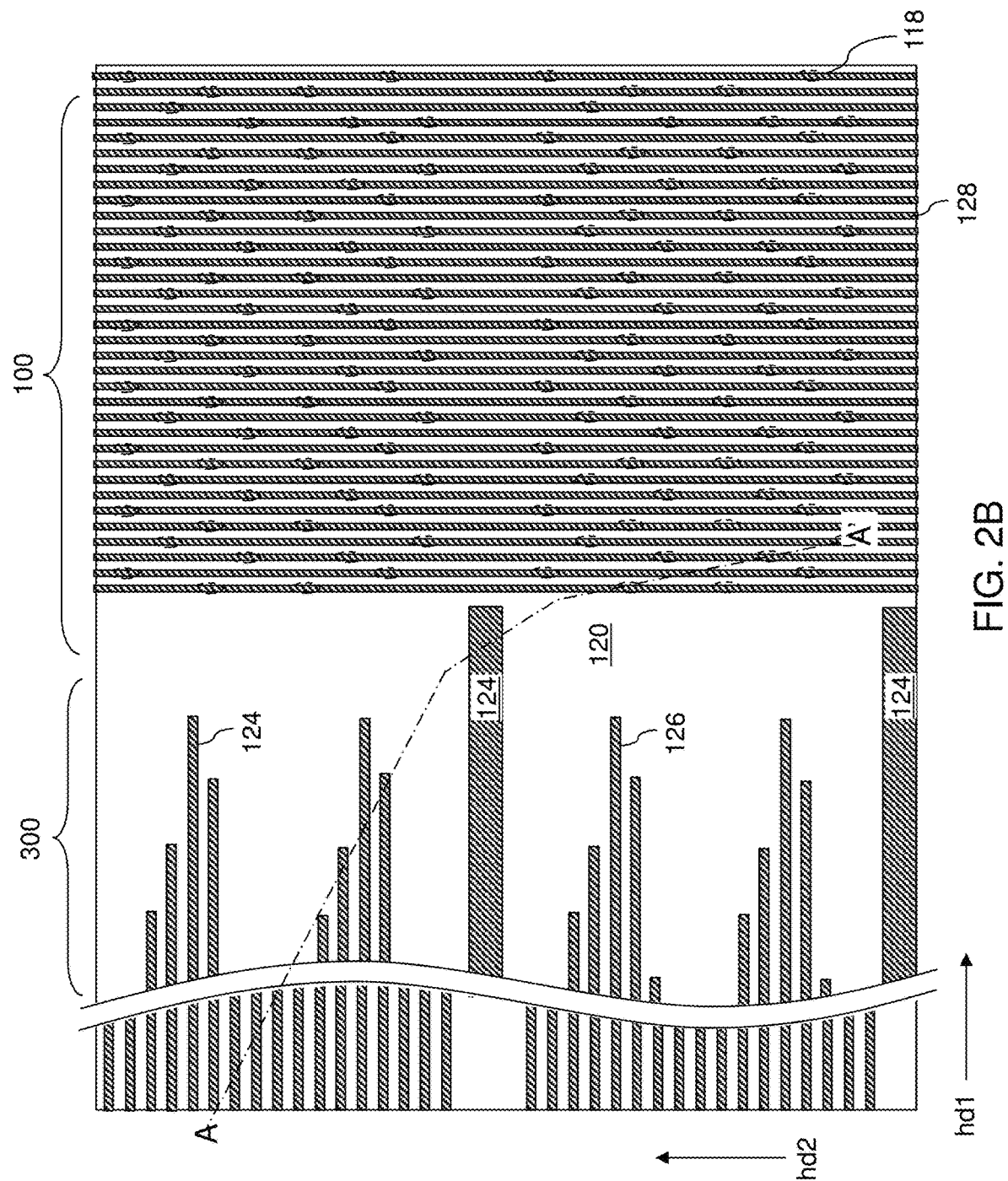

POROUS BARRIER LAYER FOR IMPROVING RELIABILITY OF THROUGH-SUBSTRATE VIA STRUCTURES AND METHODS OF FORMING THE SAME

FIELD

The present disclosure relates generally to the field of semiconductor devices, and particularly to a bonded structure using a porous barrier layer for improving reliability of through-substrate via structures and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure comprising a first semiconductor die is provided. The first semiconductor die comprises: a first semiconductor substrate having a front-side surface and a backside surface; first semiconductor devices located on the front-side surface of the first semiconductor substrate; a first dielectric material layer located on the first semiconductor devices and having formed therein conductive via structures contacting nodes of the first semiconductor devices; a second dielectric material layer located on the first dielectric material layer, more distal from the first semiconductor substrate than the first dielectric material layer is from the first semiconductor substrate, a metal interconnect structure that is not in direct contact with the first semiconductor substrate located in the second dielectric material layer; and a through-substrate via structure extending from a backside surface of the first semiconductor substrate to a proximal surface of the metal interconnect structure, wherein a horizontal portion of the through-substrate via structure that contacts the proximal surface of the metal interconnect structure comprises a porous metallic material portion having a porosity in a range from 20% to 80%.

According to another embodiment of the present disclosure, a method of forming a semiconductor structure is provided, which comprises: forming first semiconductor devices on a front-side surface of a first semiconductor substrate; forming a first dielectric material layer that contains conductive via structures formed therein over the first semiconductor devices; forming a porous dielectric material layer over the first dielectric material layer; forming a metal interconnect structure formed within a second dielectric material layer and on a top surface of the porous dielectric material layer; forming a via cavity vertically extending through the first semiconductor substrate and the first dielectric material layer and stopping on a proximal surface of the porous dielectric material layer, wherein a continuous network of pores that are free of any solid material therein continuously extends from a bottom of the via cavity to a surface of the metal interconnect structure; and forming a through-substrate via structure in the via cavity, wherein the through-substrate via structure comprises a porous metallic material portion having a porosity in a range from 20% to 80%, filling the continuous network of pores, and contacting surface portions of the metal interconnect structure.

BRIEF DESCRIPTION OF THE DRAWINGS

FIG. 2B is a top-down view of the in-process memory die of FIG. 2A.

DETAILED DESCRIPTION

Figure 1A:
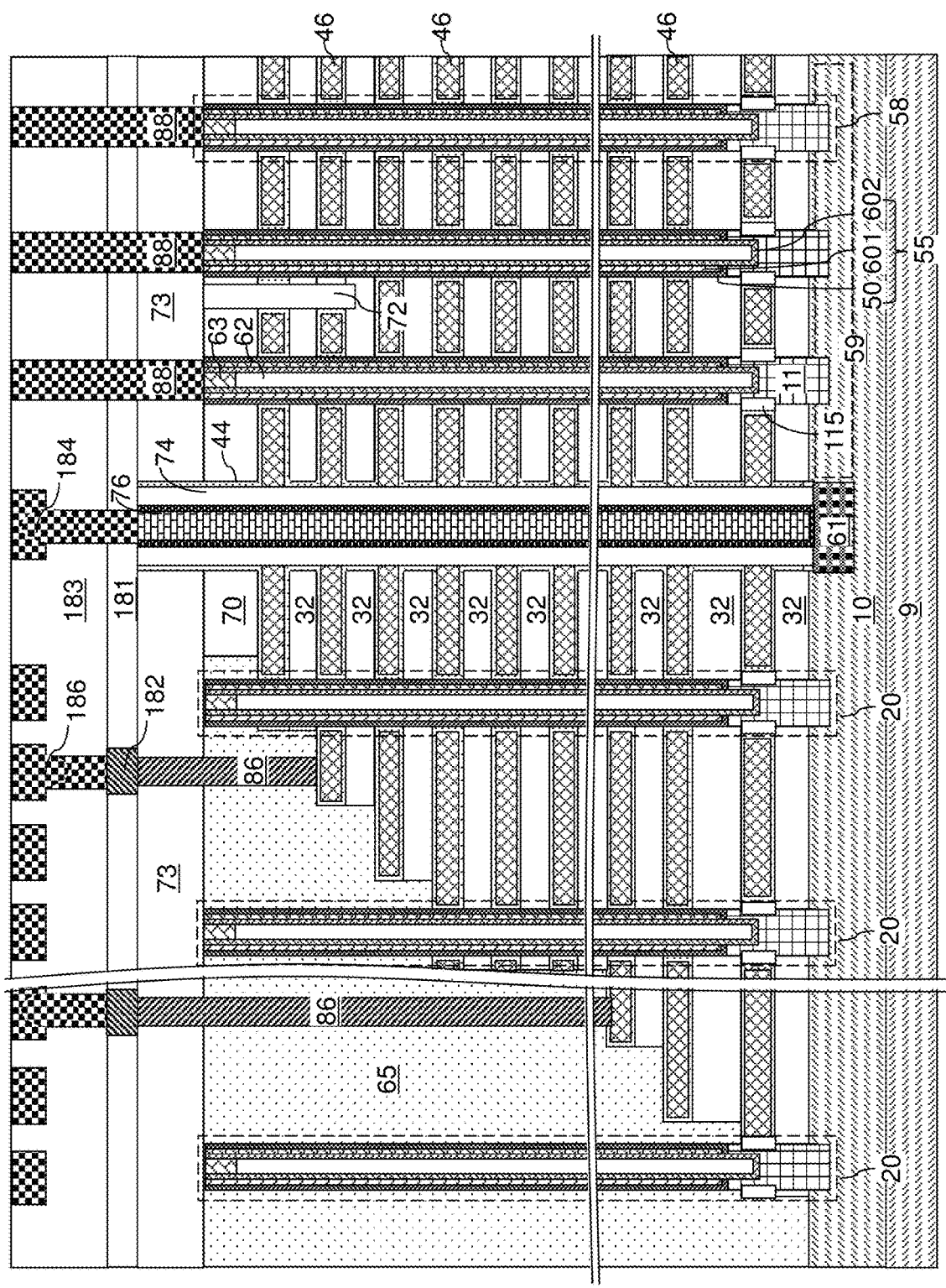
FIG. 1A is a vertical cross-sectional view of an in-process memory die after formation of contact via structures according to an embodiment of the present disclosure.

Through-substrate via structures are extensively used to provide electrical contact to bonded dies. In a bonded assembly including at least two semiconductor dies, the metal pads located at interfaces between vertically-neighboring dies may be used to provide die-to-die bonding. External wiring of the bonded assembly may be effectuated by forming through-substrate via cavities from the backside on an outer semiconductor die. In this case, the substrate of the outer semiconductor die may be thinned, for example, by grinding to a thickness that provides for the formation of via cavities through the thinned substrate. The depth of the via cavities may be selected such that the via cavities etch through the thinned substrate into underlying dielectric material layers having formed therein metal interconnect structures. The locations of the via cavities may be selected such that a horizontal surface of a metal interconnect structure is physically exposed at the bottom of each via cavity. A dielectric spacer may be formed on the sidewall of each via cavity, and a conductive material may be deposited inside each dielectric spacer to form a contact via structure.

A key challenge in formation of the contact via structure is reliability degradation due to etch damages during formation of the via cavities. For example, plasma-induced damages to metal interconnect structures may cause device degradation such as degradation in the voltage-current characteristics of field effect transistors that are connected to the metal interconnect structures that are physically exposed at the bottom of the via cavities. In addition, metal re-sputtering process may occur at a terminal step of an anisotropic etch process used to form the via cavities. The metal, such as copper, from the physically exposed top surfaces of metal interconnect structures at the bottom of the via cavities may be collaterally sputtered to the sidewalls of the via cavities, and may subsequently drift through dielectric material layers and into semiconductor devices, thereby inducing device degradation. Thus, a method and a structure are desired for preventing reliability degradation due to through-substrate vias formation processes.

Complementary metal oxide semiconductor (CMOS) devices may be formed on a same substrate as a three-dimensional memory device. However, degradation of CMOS devices due to collateral thermal cycling and hydrogen diffusion during manufacture of the three-dimensional memory device places a constraint on performance of the support circuitry including the CMOS devices. A bonded assembly of a memory die and a support die may be used as an alternative. However, bending and warpage of the memory die due to internally-generated stress may occur. The subsequent bonding of the memory die to a relatively flatter (e.g., less warped) support die presents a challenge. Embodiments of the present disclosure provide warpage-compensation methods and structures for improving yield of bonded assemblies containing a memory die and a support die, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. Each plane contains a number of memory blocks (or "blocks"), which are the smallest unit that may be erased by in a single erase operation. Each memory block contains a number of pages, which are the smallest units that may be selected for programming.

Figure 1B:
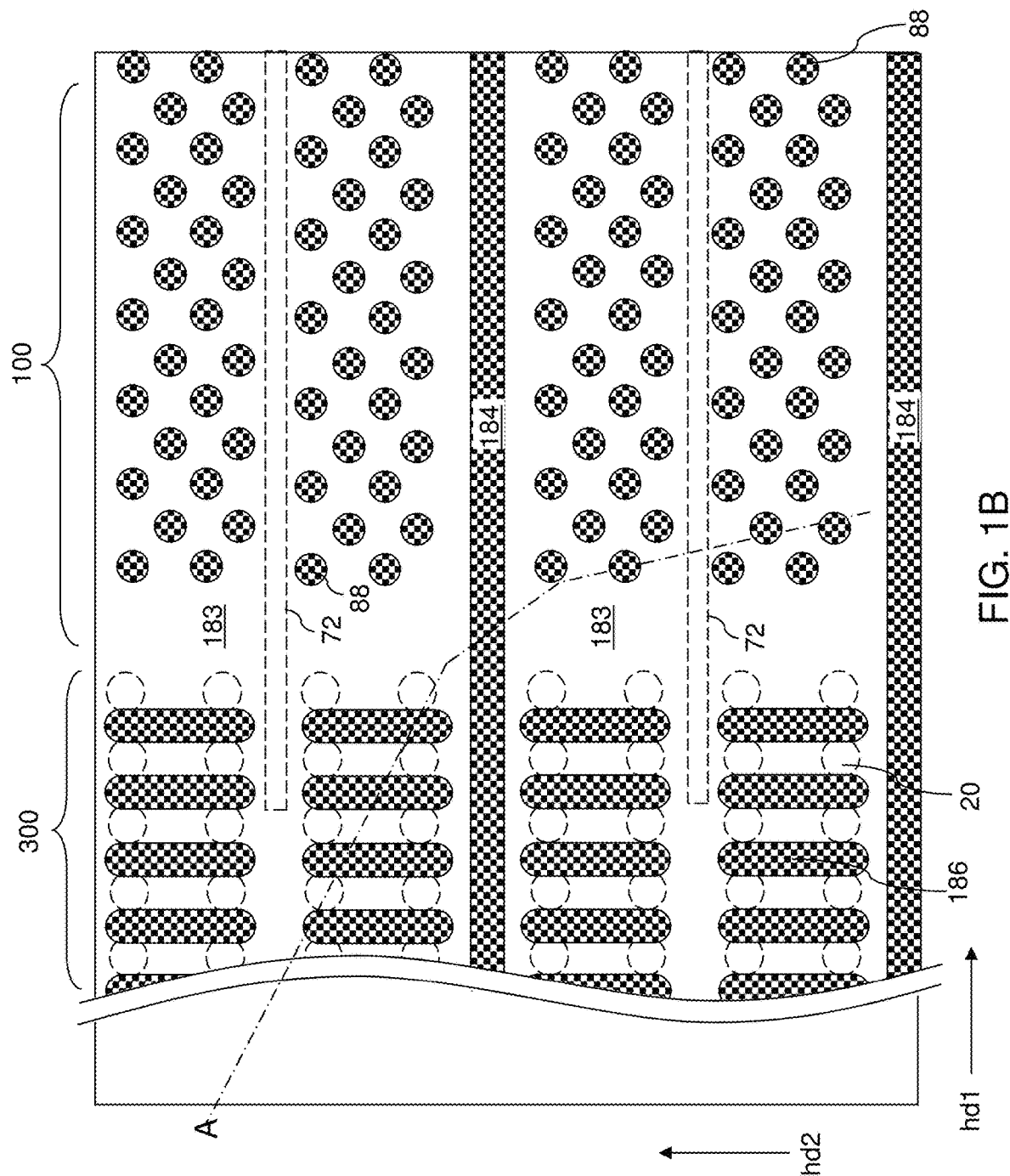
FIG. 1B is a top-down view of the in-process memory die of FIG. 1A.

FIGS. 1A and 1B illustrate an in-process exemplary memory die. The in-process memory die may be formed by providing a substrate containing a substrate semiconductor layer 9. An optional semiconductor material layer 10 may be formed on the substrate semiconductor layer 9. An alternating stack of insulating layers 32 and sacrificial material layers (not shown) are formed. An insulating cap layer 70 may be formed over the alternating stack. Drain-select-level isolation structures 72 may be optionally formed through topmost layers of the alternating stack. The insulating cap layer 70 and the alternating stack may be patterned to form stepped surfaces, and a retro-stepped dielectric material portion 65 may be formed over the stepped surfaces. Memory openings may be formed through the insulating cap layer 70 and the alternating stack to a top surface of the substrate (9, 10) in a memory array region 100. Support openings may be formed through the retro-stepped dielectric material portion 65 and patterned portions of the alternating stack to a top surface of the substrate (9, 10) in a staircase region 300. A memory opening fill structure 58 may be formed in each memory opening, and a support pillar structure 20 may be formed in each support opening. Each memory opening fill structure 58 and each support pillar structure 20 may include a pedestal channel portion 11, a memory film 50 that may include a layer stack, from outside to inside, of a blocking dielectric, a charge storage layer, and a tunneling dielectric, a vertical semiconductor channel 55 that may include a memory films 50, memory-die semiconductor channel layer 601 and a second semiconductor channel layer 602, an optional dielectric core 62, and a drain region 63. A lower contact level dielectric layer 73 may be formed over the insulating cap layer 70 and the retro-stepped dielectric material portion 65. Backside trenches may be formed through the lower contact level dielectric layer 73 and the alternating stack to a top surface of the substrate (9, 10). Backside recesses may be formed by removing the sacrificial material layers of the alternating stack. Physically exposed surfaces of the pedestal channel portions may be oxidized to form tubular dielectric spacers 115. The sacrificial material layers may be replaced with an optional backside blocking dielectric liner 44 and electrically conductive layers 46 that include word lines. Portions of the charge storage layer that are surrounded by the word lines constitute memory elements, which are arranged as a three-dimensional array of memory elements. A source region 61 may be formed at the bottom of each backside trench. A horizontal semiconductor channel 59 is formed between each source region 61 and a neighboring group of pedestal channel portions 11 in the memory openings. An insulating spacer 74 and a source contact structure 76 may be formed in each backside trench.

Layer contact via structures 86 including word line contact via structures may be formed on each electrically conductive layer 46. A middle contact level dielectric layer 181 may be deposited over the lower contact level dielectric layer 73. Contact-connection line structures 182 may be formed within the middle contact level dielectric layer 181. An upper contact level dielectric layer 183 may be formed over the middle contact level dielectric layer 181. Contact via cavities may be formed through the upper contact level dielectric layer 183, optionally through the middle contact level dielectric layer 181, and optionally through the lower contact level dielectric layer 73, for example, by a combination of a lithographic patterning process and an anisotropic etch process. Optionally, a line pattern may be formed in an upper region of a subset of the contact via cavities. Various contact via structures (88, 184, 186) may be formed through the upper contact level dielectric layer 183, the middle contact level dielectric layer 181, and the lower contact level dielectric layer 73. The contact via structures (88, 184, 186) may include drain contact via structures 88 that contact drain regions 63, word-line-connection contact via structures 186 that are formed on a top surface of a respective one of the contact-connection line structures 182 and layer contact via structures 86, and source-connection contact via structures 184 that are formed on a top surface of a respective one of the source contact structures 76.

Figure 2A:
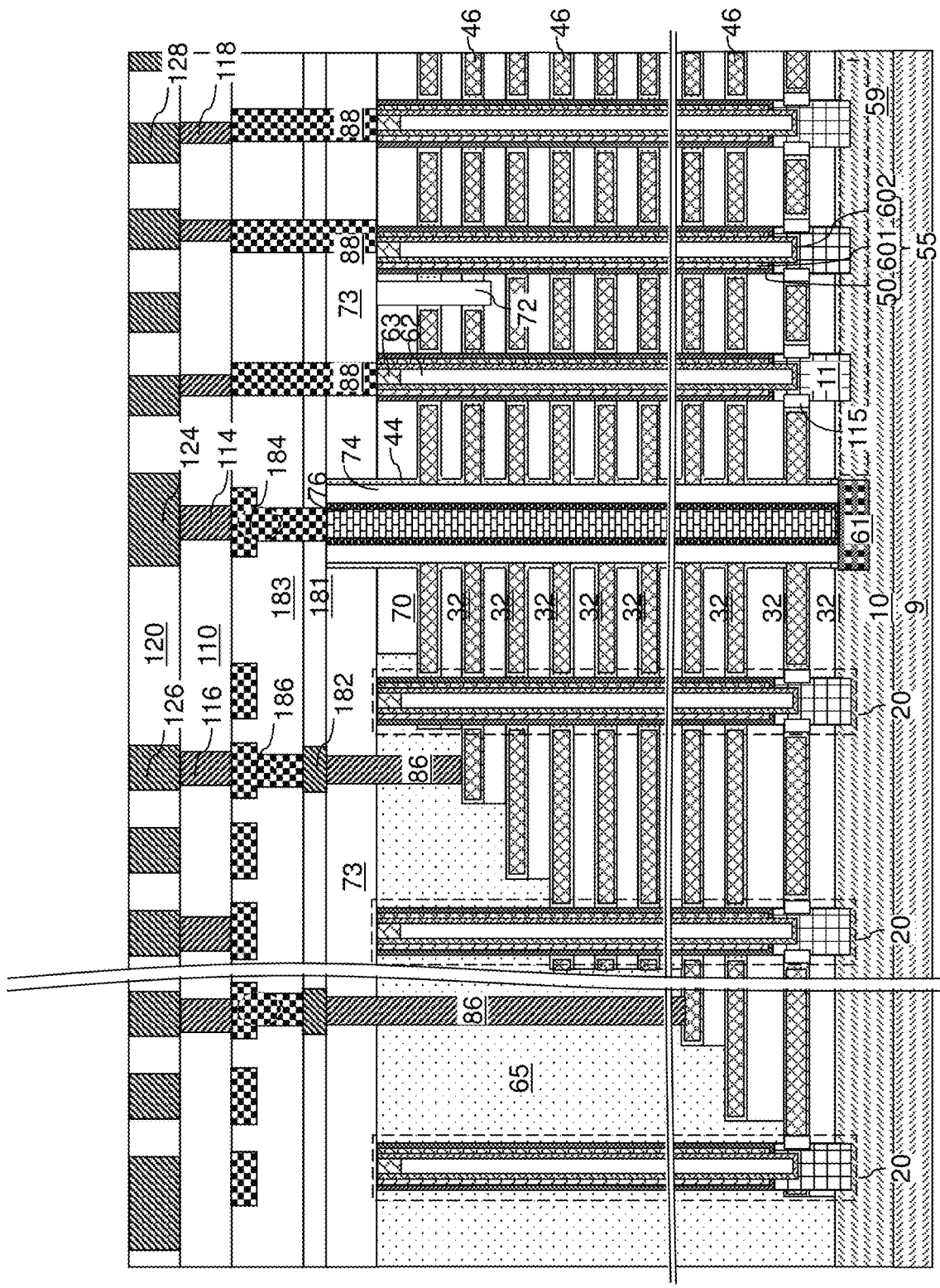
FIG. 2A is a vertical cross-sectional view of the in-process memory die after formation of bit line level structures according to an embodiment of the present disclosure.

Referring to FIGS. 2A and 2B, a first via level dielectric layer 110 may be deposited over the upper contact level dielectric layer 183. Various first via structures (118, 114, 116) may be formed in the first via level dielectric layer 110. The first via structures (118, 114, 116) may include bit-line-connection via structures 118 that may be formed on a top surface of a respective one of the drain contact via structures 88, memory-die source-connection via structures 114 that may be formed on a top surface of a respective one of the source-connection contact via structures 184, and memory-die word-line-connection via structures 116 that may be formed on a top surface of a respective one of the word-line-connection contact via structures 186.

A first line level dielectric layer 120 may be deposited over the first via level dielectric layer 110. Various first line structures (128, 124, 126) may be formed in the first line level dielectric layer 120. The first line structures (128, 124, 126) may include bit lines 128 that may be formed on a top surface of a respective one of the bit-line-connection via structures 118, memory-die source-connection line structures 124 that may be formed on a top surface of a respective one of the memory-die source-connection via structures 114, and memory-die word-line-connection line structures 126 that may be formed on a top surface of a respective one of the memory-die word-line-connection via structures 116.

Figure 3A:
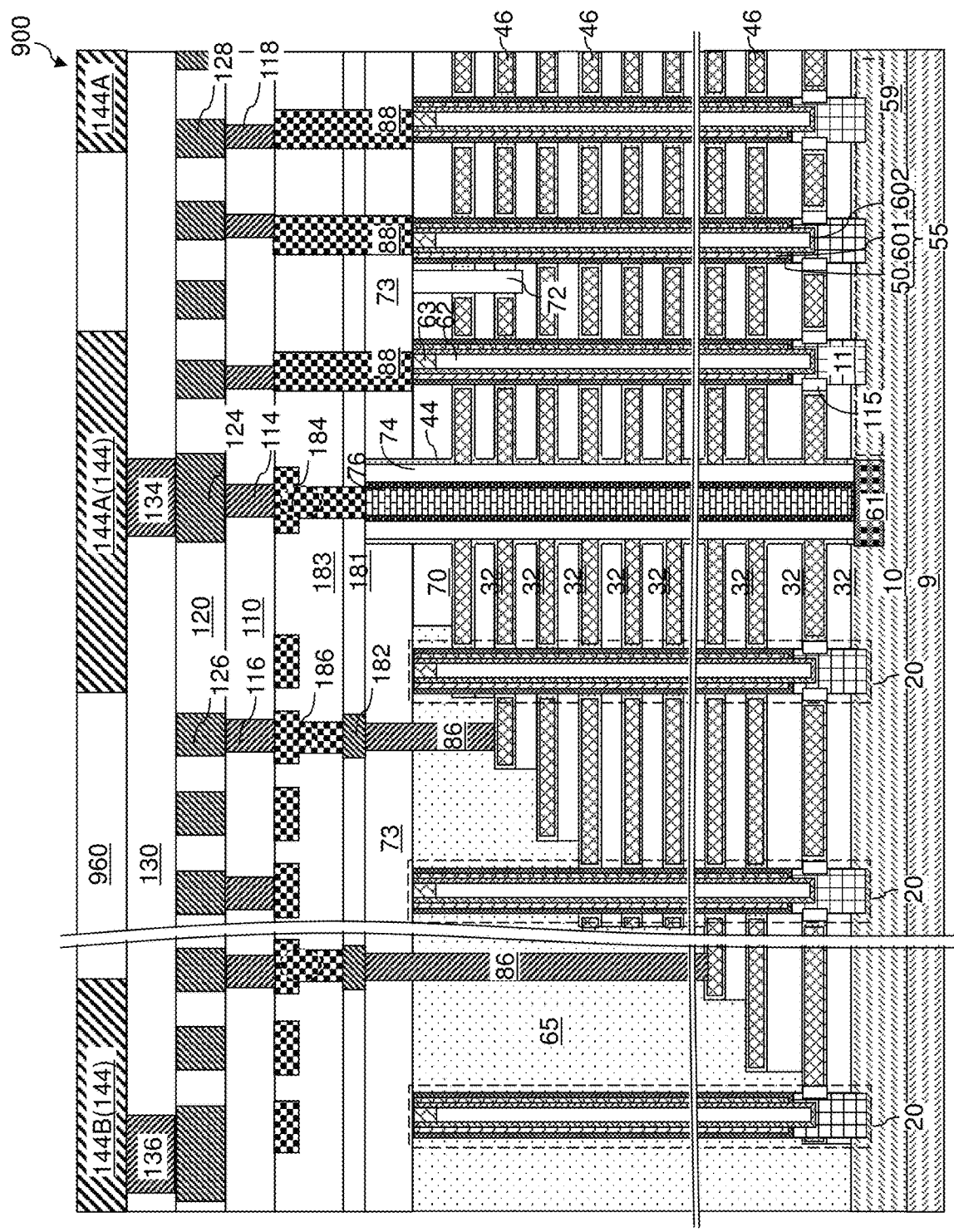
FIG. 3A is a vertical cross-sectional view of a memory die after formation of first metal bonding pads according to an embodiment of the present disclosure.
Figure 3B:
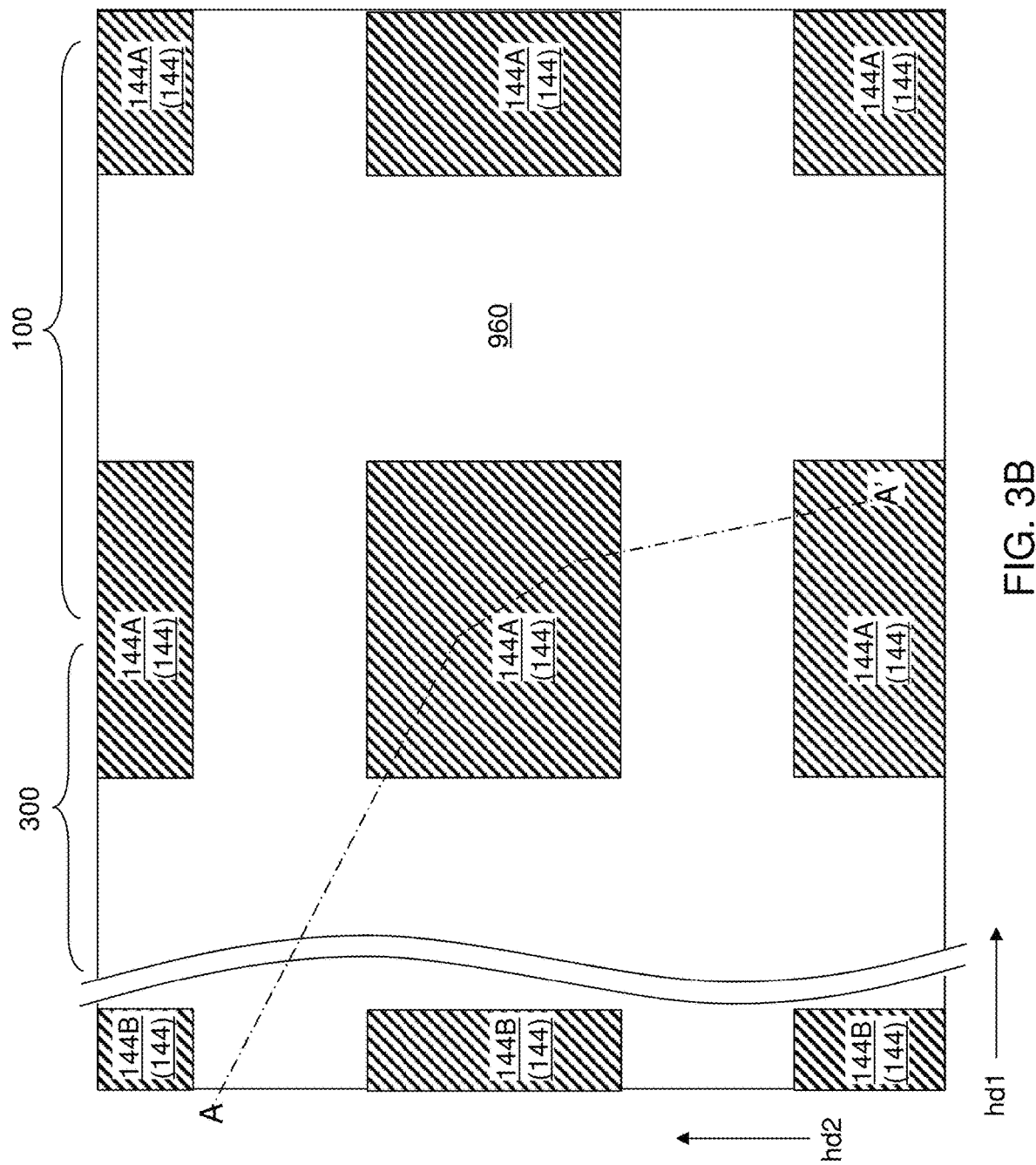
FIG. 3B is a top-down view of a region of the memory die of FIG. 3A.
Figure 3C:
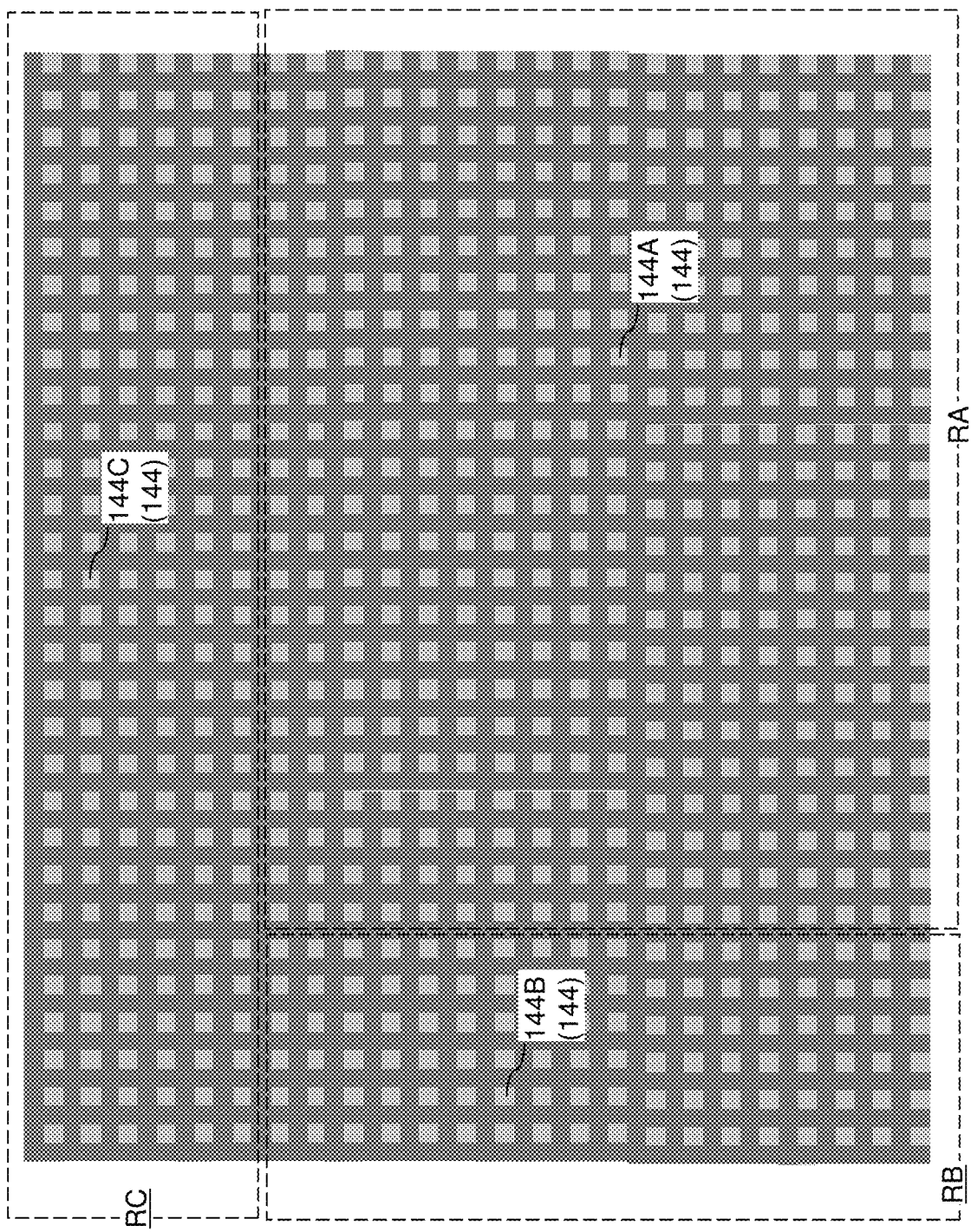
FIG. 3C is a top-down view of the memory die of FIG. 3A.

Referring to FIGS. 3A-3C, a second via level dielectric layer 130 may be deposited over the first line level dielectric layer 120. Second via structures (134, 136) may be formed through the second via level dielectric layer 130. The second via structures (134, 136) may include second source-connection via structures 134 that may be formed on a respective one of the memory-die source-connection line structures 124, second word-line-connection via structures 136 that may be formed on a respective one of the word-line-connection line structures 126, and bit-line-connection via structures (not shown) that are formed on a top surface of a respective one of the bit lines 128. The set of all metal interconnect structures located within, or below, the second via level dielectric layer 130 is herein referred to as memory-die metal interconnect structures.

A memory-die pad-level dielectric layer 960 may be formed over the second via level dielectric layer 130. Memory-die metal bonding pads 144 may be formed using the methods described above. The memory-die metal bonding pads 144 may include source-network memory-die metal bonding pads 144A provided in a first region RA, word-line-connection memory-die metal bonding pads 144B provided in a second region RB, bit-line-connection memory-die metal bonding pads 144C provided in a third region RC, and additional memory-die metal bonding pads for transmitting or receiving power or signals between the memory die 900 and a support die to be subsequently bonded to the memory die 900. The memory die 900 includes a three-dimensional array of memory elements, which may comprise annular portions of the charge storage layers within the memory films 50 that are located at each level of the electrically conductive layers 46.

Figure 4:
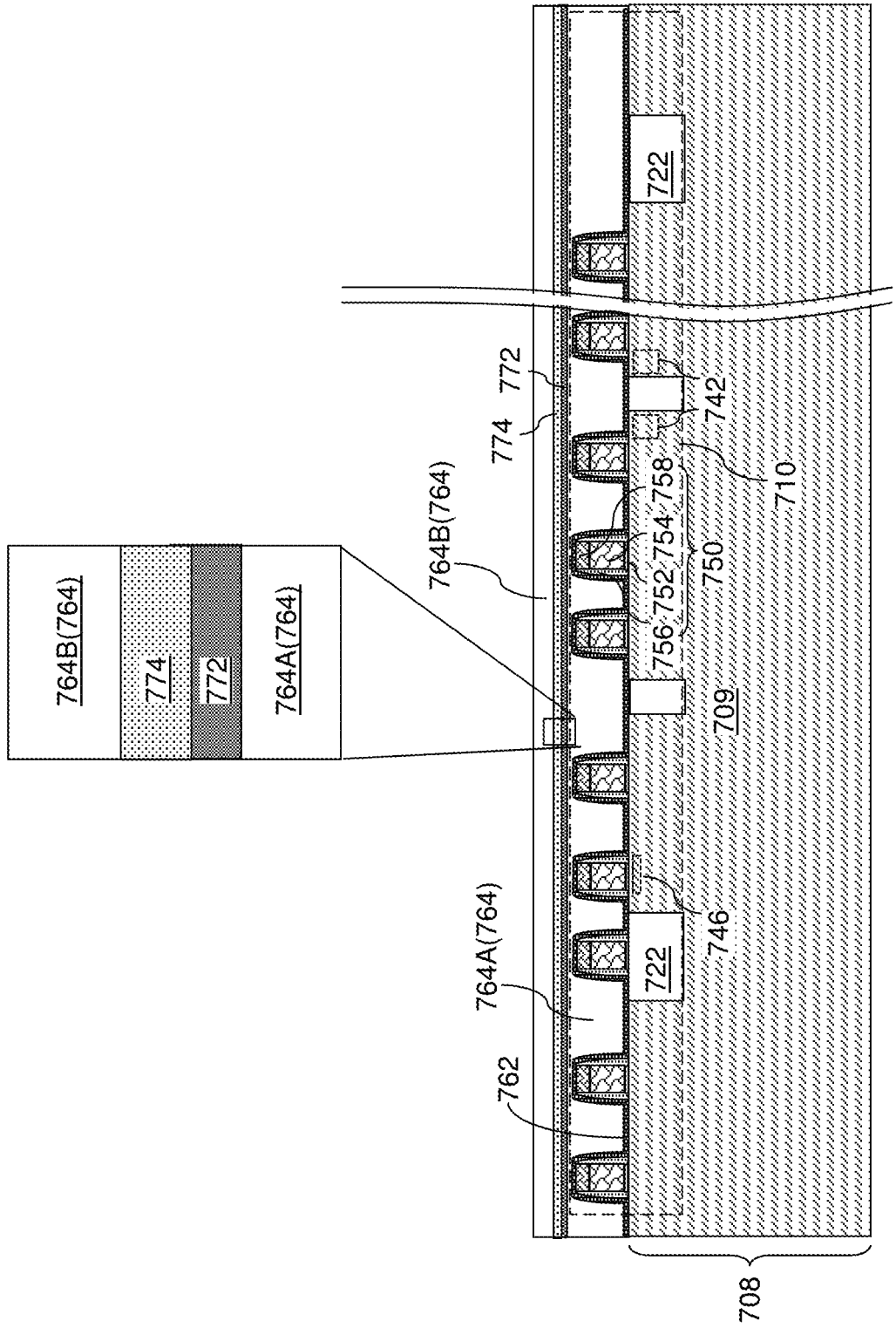
FIG. 4 is a vertical cross-sectional view of a support die after formation of a first dielectric material layer, a porous dielectric material layer, and a second dielectric material layer according to an embodiment of the present disclosure.

Referring to FIG. 4, an exemplary structure is illustrated, which may be used to form a support die containing a peripheral circuit configured to control operation of a three-dimensional array of memory elements in the memory die 900. The exemplary structure may include a support-die substrate 708, which may be a first semiconductor substrate. The support-die substrate 708 includes a front-side surface (which is a first planar surface) on the top side and a backside surface (which is a second planar surface) on the bottom side. The support-die substrate 708 may include a substrate semiconductor layer 709, which is also referred to as a first substrate semiconductor layer. Shallow trench isolation structures 722 may be provided in a surface region of the substrate semiconductor layer 709 to provide electrical isolation to and from the various semiconductor devices 710 of the peripheral circuit.

The peripheral circuit includes various semiconductor devices 710, which are also referred to as first semiconductor devices. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which may comprise the electrically conductive layers 46, and source power supply field effect transistors that generate power to be supplied to the source regions 61 in the memory die 900.

Dielectric material layers may be formed over the semiconductor devices 710. For example, a dielectric liner 762 (such as a silicon nitride liner) may be formed to apply mechanical stress to the various field effect transistors and/or to prevent diffusion of hydrogen or impurities from the interconnect-level dielectric layers 760 into the semiconductor devices 710. A first dielectric material layer 764A may be formed over the dielectric liner 762. In one embodiment, the first dielectric material layer 764A may be a device-contact-via-level dielectric material layer through which conductive via structures are subsequently formed. The first dielectric material layer 764A may include undoped silicate glass, a doped silicate glass, non-porous organosilicate glass, or a porous organosilicate glass with less porosity than the porosity of a porous dielectric material layer to be subsequently formed thereupon. The thickness of the first dielectric material layer 764A may be selected such that the entirety of the top surface of the first dielectric material layer 764A overlies a horizontal plane including the topmost surfaces of the gate structures 750. The top surface of the first dielectric material layer 764A may be coplanar with the topmost surfaces of the dielectric liner 762, or may be located above the horizontal plane including the topmost surfaces of the dielectric liner 762.

While the present disclosure is described using an embodiment in which the first dielectric material layer 764A may be formed as a device-contact-via-level dielectric material layer, embodiments are expressly contemplated herein in which the first dielectric material layer 764A may be formed as a dielectric material layer located over the device-contact-via-level dielectric material layer. In such embodiments, at least one underlying dielectric material layer (which may be a via-level dielectric material layer or a line-level dielectric material layer) having formed therein a respective set of metal interconnect structures (such as metal via structures or metal line structures) may be formed over the semiconductor devices 710 prior to formation of the first dielectric material layer 764A, and the first dielectric material layer 764A may be formed as a line-level dielectric material layer or as a via-level dielectric material layer.

An etch stop dielectric layer 772 may be optionally formed over the first dielectric material layer 764A. The etch stop dielectric layer 772 includes a dielectric material different from the material of the first dielectric material layer 764A, and may be used as an etch stop material during a subsequent anisotropic etch step that etches the material of the first dielectric material layer 764A. For example, if the first dielectric material layer 764A include undoped silicate glass, a doped silicate glass, or porous or non-porous organosilicate glass, the etch stop dielectric layer 772 may include silicon nitride or a dielectric metal oxide (such as aluminum oxide). The thickness of the etch stop dielectric layer 772 may be selected based on the selectivity of the anisotropic etch step that etches the material of the first dielectric material layer 764A relative to the material of the etch stop dielectric layer 772, and may be in a range from 2 nm to 80 nm, such as from 4 nm to 40 nm, although lesser and greater thicknesses may also be used.

A porous dielectric material layer 774 may be formed on the top surface of the etch stop dielectric layer 772, or on the top surface of the first dielectric material layer 764A in embodiments in which the etch stop dielectric layer 772 is omitted. The porous dielectric material layer 774 may include a porous dielectric material having high porosity. In one embodiment, the porosity of the porous dielectric material layer 774 may be high enough to provide a continuous network of vacant pores that extends from a bottom surface of the porous dielectric material layer 774 to a top surface of the porous dielectric material layer 774.

As used herein, a porous dielectric material having porosity that is high enough to provide a continuous network of vacant pores that extends from a bottom surface of the porous dielectric material to a top surface of the porous dielectric material is referred to as an "ultraporous dielectric material." In such embodiments, the continuous network of vacant pores and a continuous network of a dielectric matrix complementarily may occupy at least 95% of the entire volume of the porous dielectric material with less than 5% of the volume of the porous dielectric material being occupied with isolated pores.

In one embodiment, the porous dielectric material layer 774 may include an ultraporous dielectric material. In one embodiment, the porous dielectric material layer 774 may have a porosity in a range from 20% to 80%, such as from 30% to 70% and/or from 40% to 60%. In one embodiment, the porous dielectric material layer 774 may comprise, and/or may consist of, a porous organosilicate glass, and may have a thickness in a range from 6 nm to 60 nm, such as from 12 nm to 30 nm, although lesser and greater thicknesses may also be used. In one embodiment, the average pore diameter in the porous dielectric material layer 774 may be in a range from 2 nm to 20 nm, such as from 4 nm to 10 nm, although lesser and greater average pore diameters may also be used. The average pore diameter for a porous dielectric material may be calculated by fitting volumes of spheroids (a sphere with optional elongations along one of the three major axis) to the curved surfaces of the pores, and by calculating the diameter of a sphere having a same volume as the average volume of the spheroids.

A second dielectric material layer 764B may be deposited over the porous dielectric material layer 774. The second dielectric material layer 764B may include a dielectric material such as undoped silicate glass, a doped silicate glass, non-porous organosilicate glass, or a porous organosilicate glass having a lower porosity than the porous dielectric material layer 774. The material of the second dielectric material layer 764B may be the same as, or may be different from, the material of the porous dielectric material layer 774. The thickness of the second dielectric material layer 764B may be in a range from 100 nm to 600 nm, although lesser and greater thicknesses may also be used. The first dielectric material layer 764A and the second dielectric material layer 764B are components of interconnect-level dielectric material layers 764 that may be deposited over the semiconductor devices 710 and are used to form various metal interconnect structures therein.

Figure 5:
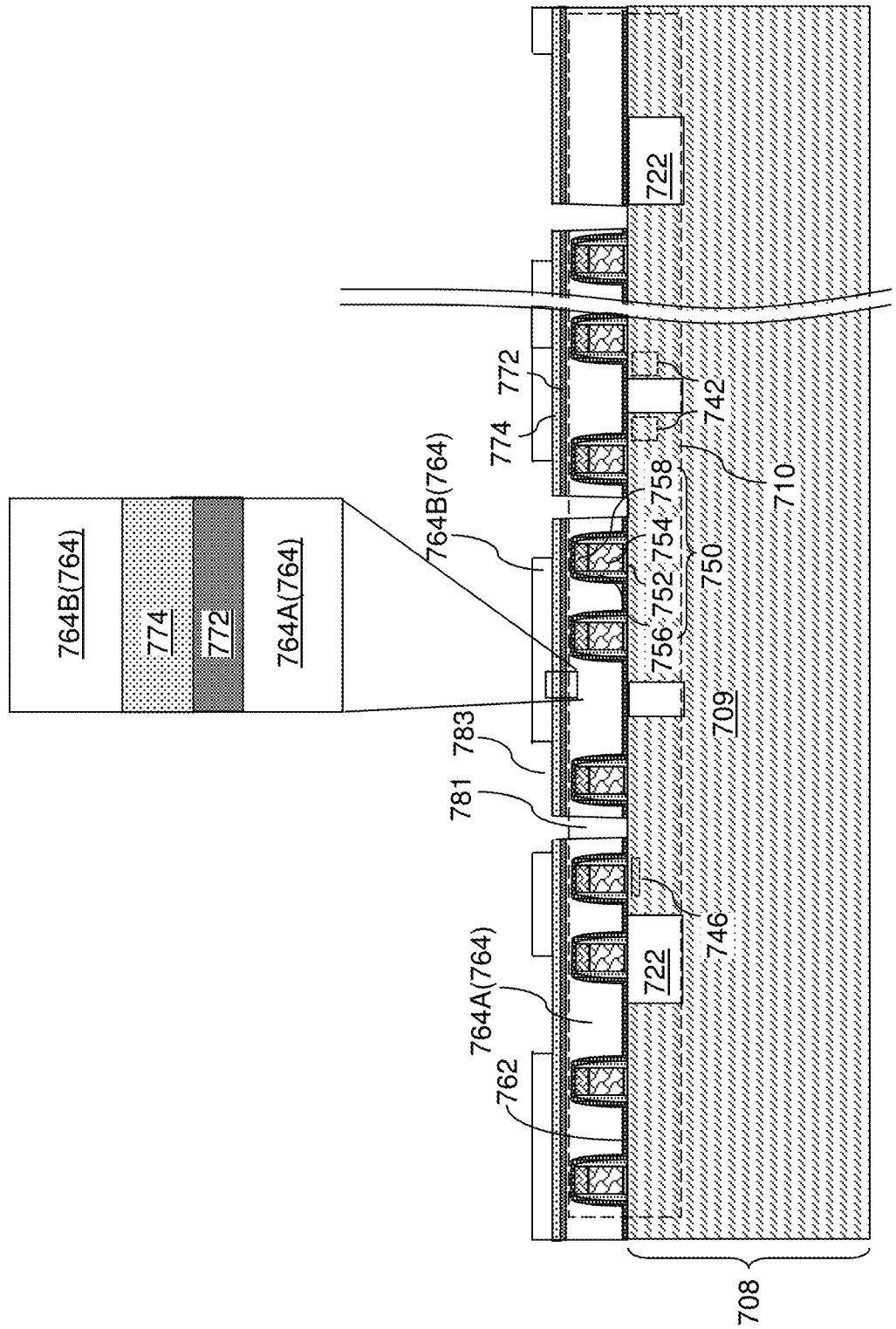
FIG. 5 is a vertical cross-sectional view of the support die after formation of via cavities through the first dielectric material layer and line cavities through the second dielectric material layer according to an embodiment of the present disclosure.

Referring to FIG. 5, the second dielectric material layer 764B, the porous dielectric material layer 774, the etch stop dielectric layer 772, and the first dielectric material layer 764A may be patterned to form various via cavities 781 and various line cavities 783. For example, a set of two lithographic patterning processes may be used to form the various via cavities 781 and the various line cavities 783. A dual damascene patterning process may be used. In this case, a first lithographic patterning process and a first anisotropic etch process may be performed to pattern one set of cavities selected from the via cavities 781 and the line cavities 783, and a second lithographic patterning process and a second anisotropic etch process may be performed to pattern another set of cavities selected from the via cavities 781 and the line cavities 783. In one embodiment, the via cavities 781 may be formed prior to formation of the line cavities 783. In another embodiment, the line cavities 783 may be formed prior to formation of the via cavities 781. The chemistry of the anisotropic etch processes may be selected such that the anisotropic etch process that etches the material of the second dielectric material layer 674B stops on the porous dielectric material layer 774. Thus, the bottom surfaces of the line cavities 783 may be coplanar with the top surface of the porous dielectric material layer 774, or may be recessed into the porous dielectric material layer 774 by less than 50%, and/or by less than 20%, of the initial thickness of the porous dielectric material layer 774.

Figure 6:
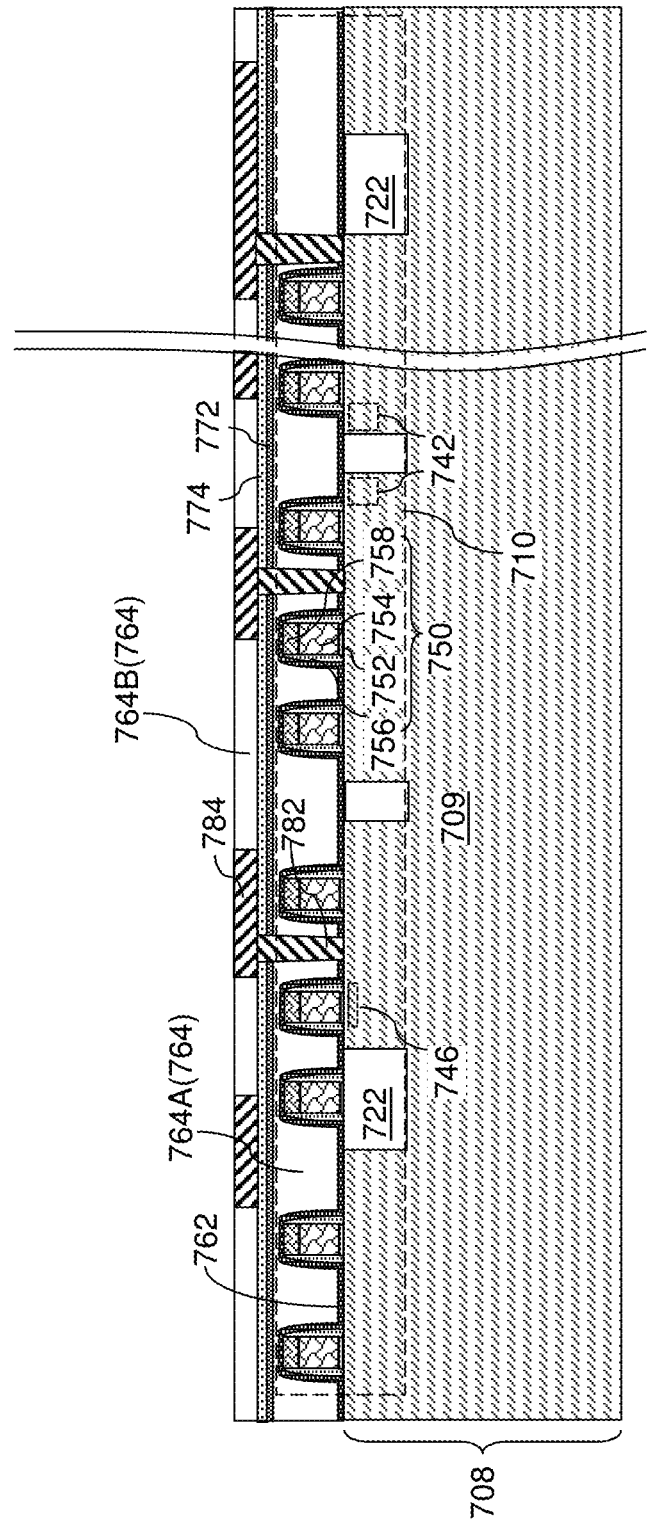
FIG. 6 is a vertical cross-sectional view of the support die after formation of conductive via structures and metal lines according to an embodiment of the present disclosure.

Referring to FIG. 6, at least one conductive material may be deposited in the via cavities 781 and in the line cavities 783. The at least one conductive material may include, for example, a metallic liner including a conductive metal nitride (such as TiN, TaN, and/or WN) and a metal fill material, which may be an elemental metal such as Cu, W, Ru, Mo, or Co. The thickness of the metallic liner may be in a range from 2 nm to 60 nm, such as from 4 nm to 30 nm, and the thickness of the metal fill material may be sufficiently high to fill the entire volumes of the via cavities 781 and the line cavities 783. Excess portions of the at least one conductive material located over a horizontal plane including the top surface of the second dielectric material layer 764B may be removed by a planarization process such as chemical mechanical planarization (CMP). Each remaining portion of the at least one conductive material filling a via cavity 781 constitutes a conductive via structure 782, and each remaining portion of the at least one conductive material filling a line cavity 783 constitutes a conductive line structure 784. The conductive via structures 782 and the conductive line structures 784 may be metal interconnect structures consisting essentially of at least one metallic material. In one embodiment, each of the conductive via structures 782 and the conductive line structures 784 may consist of a respective metallic liner and a respective metal fill portion.

Figure 7:
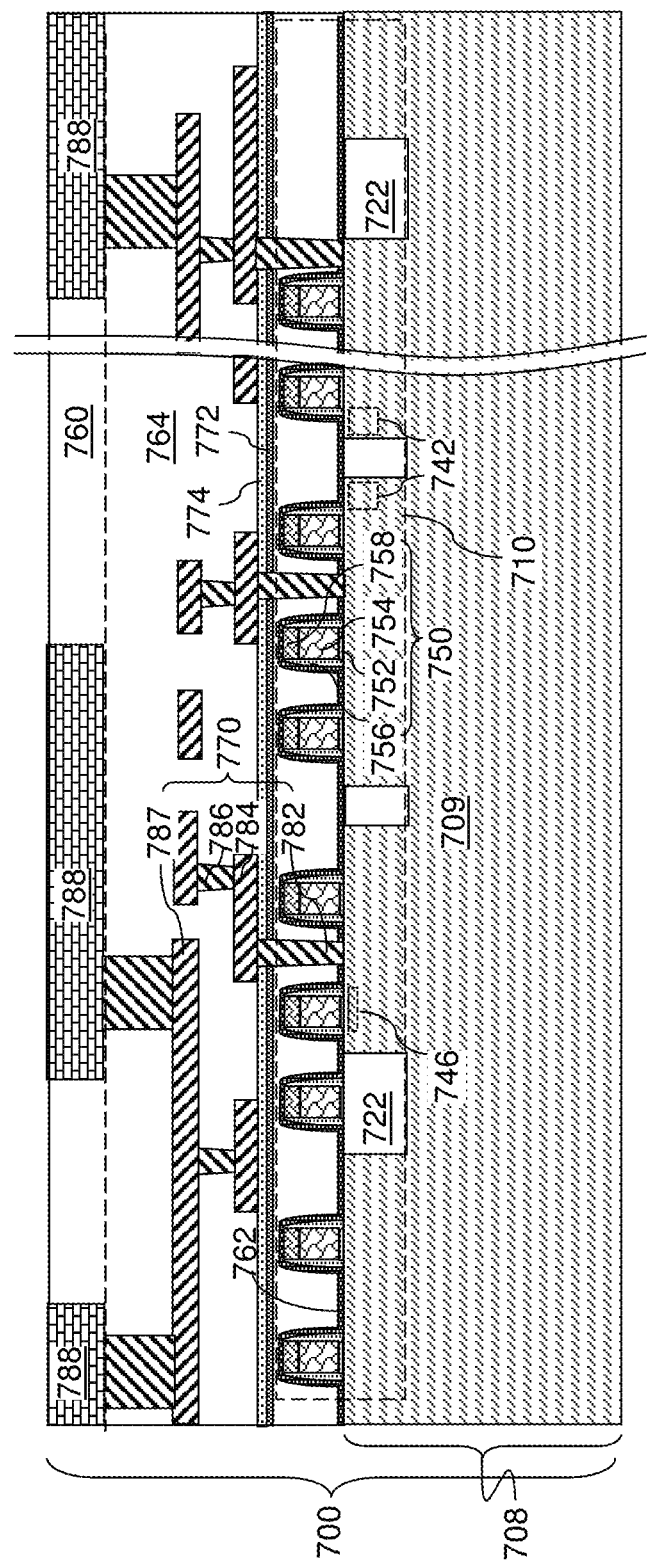
FIG. 7 is a vertical cross-sectional view of the support die after formation of upper dielectric material layers, upper metal interconnect structures, and bonding pads according to an embodiment of the present disclosure.

Referring to FIG. 7, additional component dielectric material layers of the interconnect-level dielectric material layers 764 may be formed over the second dielectric material layer 764B, and additional metal interconnect structures 770 may be formed within the additional component dielectric material layers of the interconnect-level dielectric material layers 764. The metal interconnect structures 770 may include additional conductive via structures 784, 786 and additional conductive line structures 787.

A support-die pad-level dielectric layer 760 may be formed on the interconnect-level dielectric material layers 764. Support-die metal bonding pads 788 may be formed in the support-die pad-level dielectric layer 760. A support die 700 may thus be provided. The support-die metal bonding pads 788 may be configured to mate with the memory-die metal bonding pads 144 to provide electrically conductive paths between the memory die 900 and the support die 700.

Figure 8:
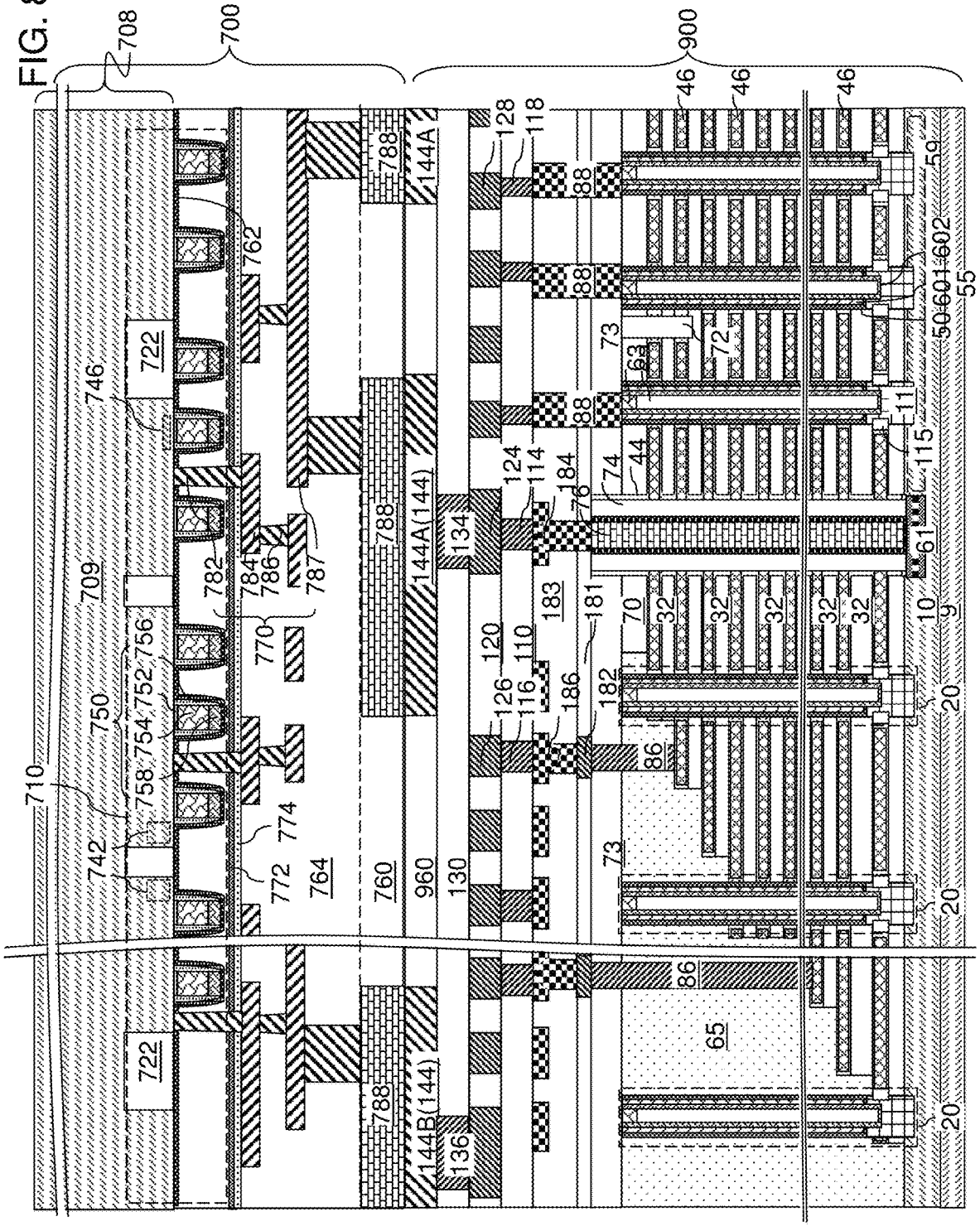
FIG. 8 is a vertical cross-sectional view of a bonded assembly of the memory die and the support die according to an embodiment of the present disclosure.

Referring to FIG. 8, the support die 700 of FIG. 7 may be bonded to the memory die 900 of FIG. 3. Generally, a first semiconductor die (such as the support die 700) including a porous dielectric material layer 774 may be bonded to a second semiconductor die (such as the memory die 900). The second semiconductor die (such as the memory die 900) may be bonded to the first semiconductor die (such as the support die 700) via die-to-die bonding such that the frontside surface of a first semiconductor substrate (such as the support-die substrate 708) is more proximal to the second semiconductor die than a backside surface of the first semiconductor substrate is to the second semiconductor die. For example, the support-die metal bonding pads 788 of the support die 700 may be bonded to the memory-die metal bonding pads 144 of the memory die 900 using metal-to-metal bonding such as copper-to-copper bonding.

Figure 9:
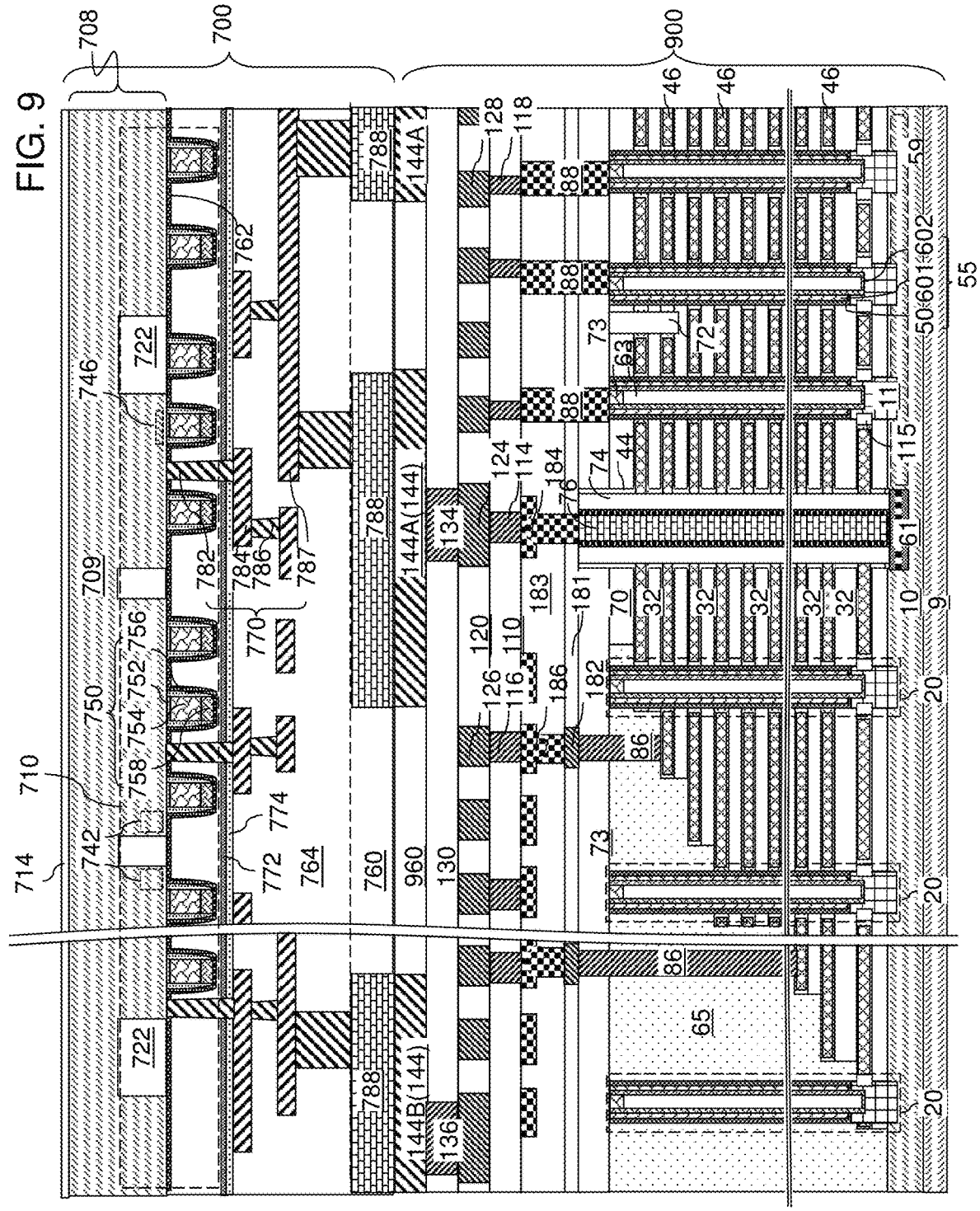
FIG. 9 is a vertical cross-sectional view of the bonded assembly after thinning the substrate of the support die according to an embodiment of the present disclosure.

Referring to FIG. 9, the first semiconductor substrate (such as the substrate semiconductor layer 709 of the support-die substrate 708) of the first semiconductor die (such as the support die 700) may be thinned after bonding the first semiconductor die to the second semiconductor die (such as the memory die 900), for example, by grinding. Generally, the first semiconductor substrate may be thinned by removing a backside portion thereof such that a remaining portion of the first semiconductor substrate has a thickness in a range from 1 micron to 60 microns. The thickness of the substrate semiconductor layer 709 may be in a range from 1 microns to 60 microns after thinning. A backside insulating layer 714 may be formed the backside surface of thinned substrate semiconductor layer 709.

Figure 10:
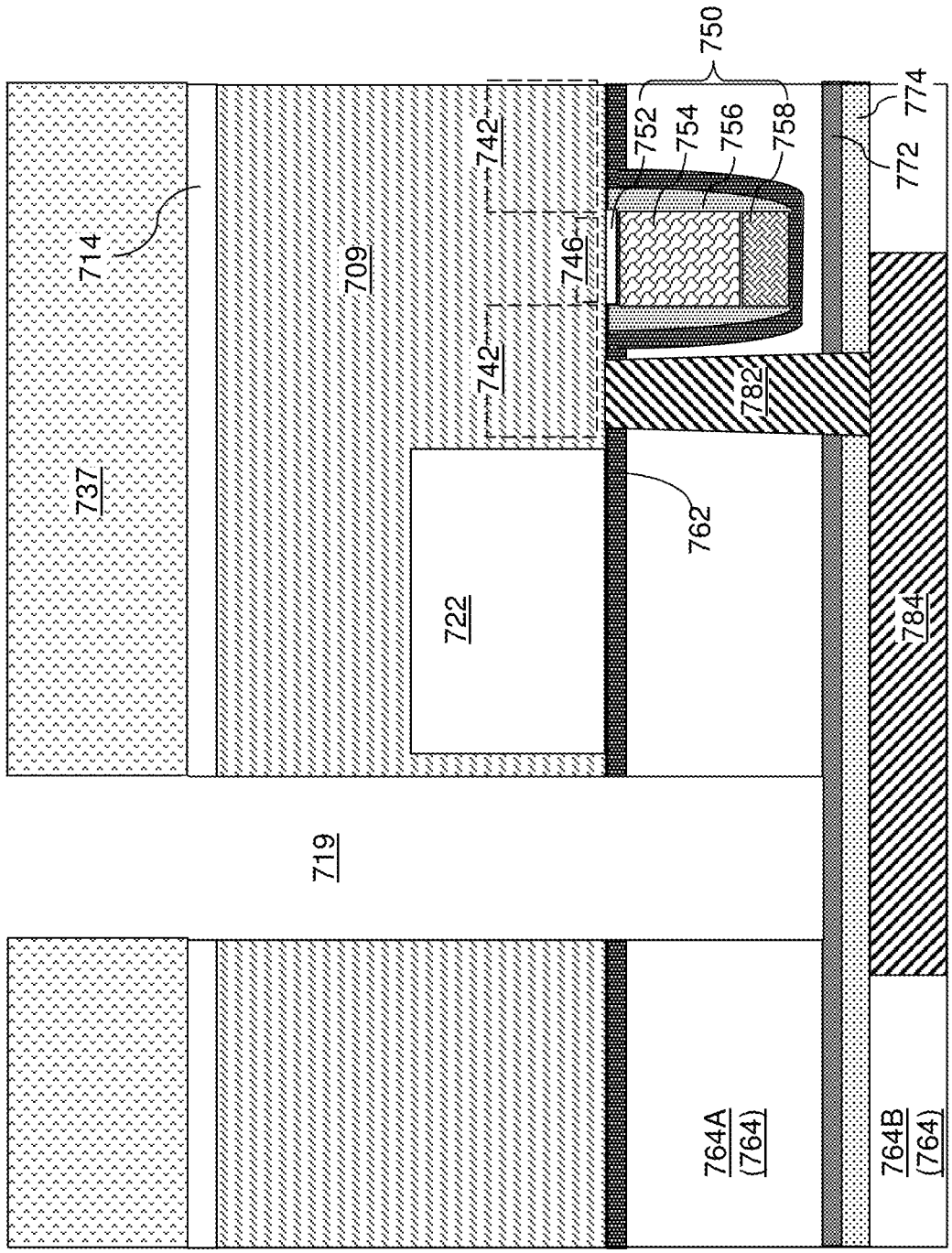
FIG. 10 is a vertical cross-sectional view of a region of the support die of the bonded assembly after formation of a via opening according to an embodiment of the present disclosure.

Referring to FIG. 10, a photoresist layer 737 may be applied over the backside insulating layer 714, and may be lithographically patterned to form openings 719 in areas in which through-substrate via structures are to be subsequently formed. Each through-substrate via structure may be formed on a respective one of the metal interconnect structures within the first semiconductor die (such as the support die). For example, each through-substrate via structure may be formed on a respective one of the conductive line structures 784. In this case, each opening 719 in the photoresist layer 737 may be formed within the area of a respective one of the conductive line structures 784 and outside the areas of the semiconductor devices 710 on the substrate semiconductor layer 709.

An anisotropic etch process may be performed to transfer the pattern of the openings in the photoresist layer 737 through the backside insulating layer 714, the substrate semiconductor layer 709, the optional dielectric liner 762, and the first dielectric material layer 764A. The anisotropic etch process may include a sequence of anisotropic etch steps that sequentially etch the backside insulating layer 714, the substrate semiconductor layer 709, the optional dielectric liner 762, and the first dielectric material layer 764A with selectivity to a respective underlying material layer. The first dielectric material layer 764A may be etched by an anisotropic etch step that etches the material of the first dielectric material layer 764A selective to the material of the etch stop dielectric layer 772 if the etch stop dielectric layer 772 is present. In this case, the anisotropic etch process may include an etch step having an etch chemistry that etches the first dielectric material layer 764A selective to the etch stop dielectric layer 772. For example, if the first dielectric material layer 764A includes undoped silicate glass, a doped silicate glass, non-porous organosilicate glass, or a porous silicate glass and if the etch stop dielectric layer 772 includes silicon nitride or a dielectric metal oxide, the anisotropic etch step may etch a silicon-oxide based dielectric material or a SiCOH-based material of the first dielectric material layer 764A selective to silicon nitride or selective to a dielectric metal oxide. Alternatively, if the etch stop dielectric layer 772 is not present, the anisotropic etch process may etch through the material of the first dielectric material layer 764A selective to the material of the porous dielectric material layer 774. A via opening 719 may be formed through the first semiconductor substrate of the first semiconductor die (such as the substrate semiconductor layer 709 of the support die 700) and through the first dielectric material layer 764A underneath each opening in the photoresist layer 737 using the anisotropic etch process. Each via opening 719 may vertically extend through the first semiconductor substrate 709 and the first dielectric material layer 764A with a straight sidewall that extends from an interface of the first dielectric material layer 764A with the etch stop dielectric layer 772 or with the porous dielectric material layer 774 to an interface between the backside surface of the substrate semiconductor layer 709. The photoresist layer 737 may be subsequently removed, for example, by ashing.

Figure 11:
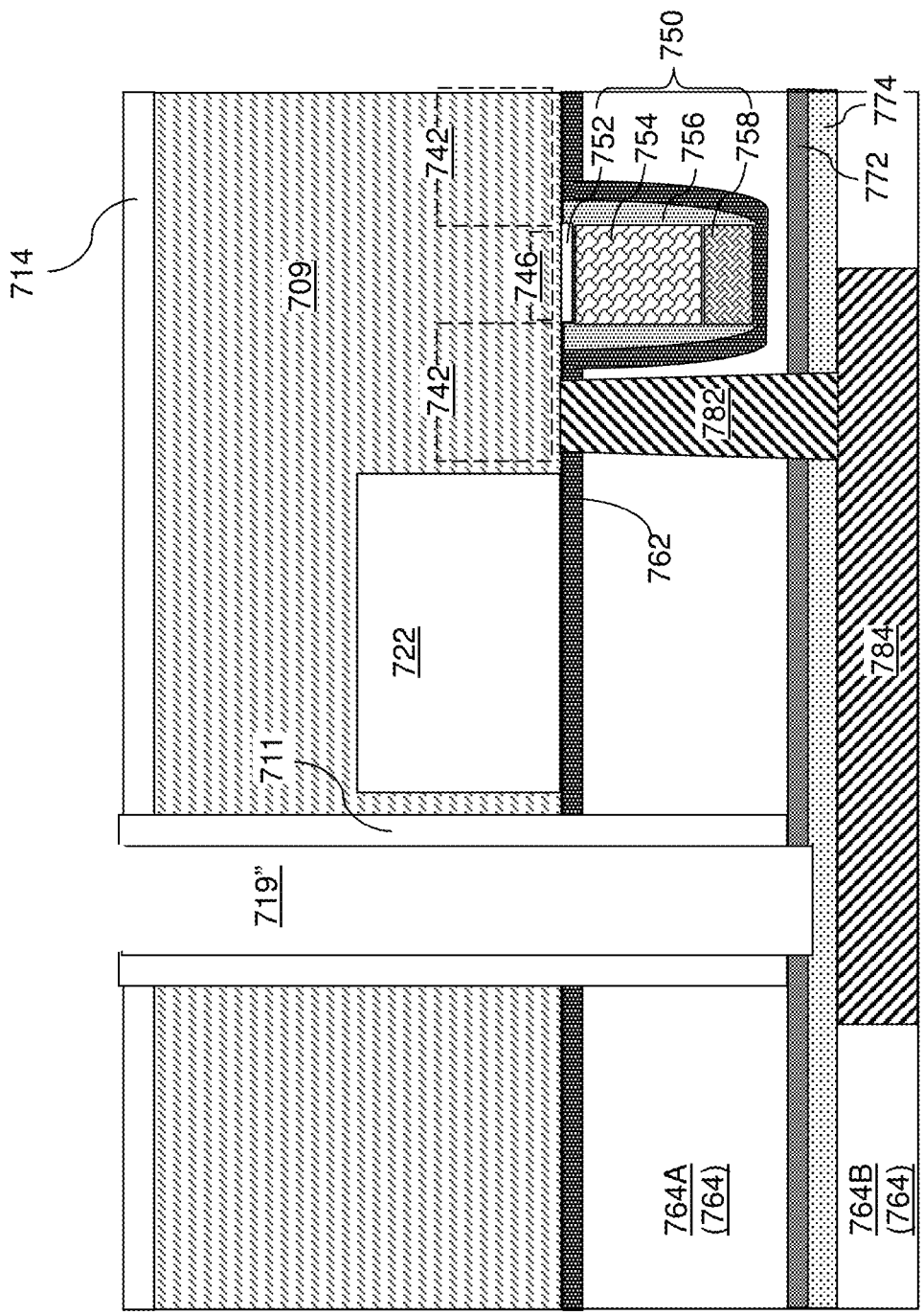
FIG. 11 is a vertical cross-sectional view of a region of the support die of the bonded assembly after formation of a tubular dielectric spacer according to an embodiment of the present disclosure.

Referring to FIG. 11, a dielectric material such as silicon oxide and/or silicon nitride may be formally deposited in the via openings 719 and over the top surface of the backside insulating layer 714 to form a conformal dielectric material layer. The conformal dielectric material layer may have a thickness in a range from 10 nm to 400 nm, such as from 20 nm to 200 nm, although lesser and greater thicknesses may also be used. An anisotropic etch process may be performed to remove horizontal portions of the deposited dielectric material from above the backside insulating layer 714 and at the bottom of each via opening 719. The anisotropic etch process may use an etch chemistry that is selective to a material layer that underlies the conformal dielectric material layer at the bottom of the via openings 719 (which may be the etch stop dielectric layer 772 or the porous dielectric material layer 774).

Each remaining vertical portion of the conformal dielectric material layer constitutes a tubular dielectric spacer 711. Each tubular dielectric spacer 711 may be formed on a straight sidewall of a respective via opening 719. Each tubular dielectric spacer 711 may have an annular end surface that contacts an underlying material layer, which may be the etch stop dielectric layer 772 if the etch stop dielectric layer 772 is present, or may be the porous dielectric material layer 774 if the etch stop dielectric layer 772 is not present. The annular end surface of each tubular dielectric spacer 711 may be vertically spaced from an underlying metal interconnect structure (such as the conductive line structure) at least by the thickness of the portion of the porous dielectric material layer 774 that underlies the respective via opening 719. An in-process via cavity 719" may be present within the unfilled volume of the via opening 719 that is laterally surrounded by the tubular dielectric spacer 711.

Figure 12:
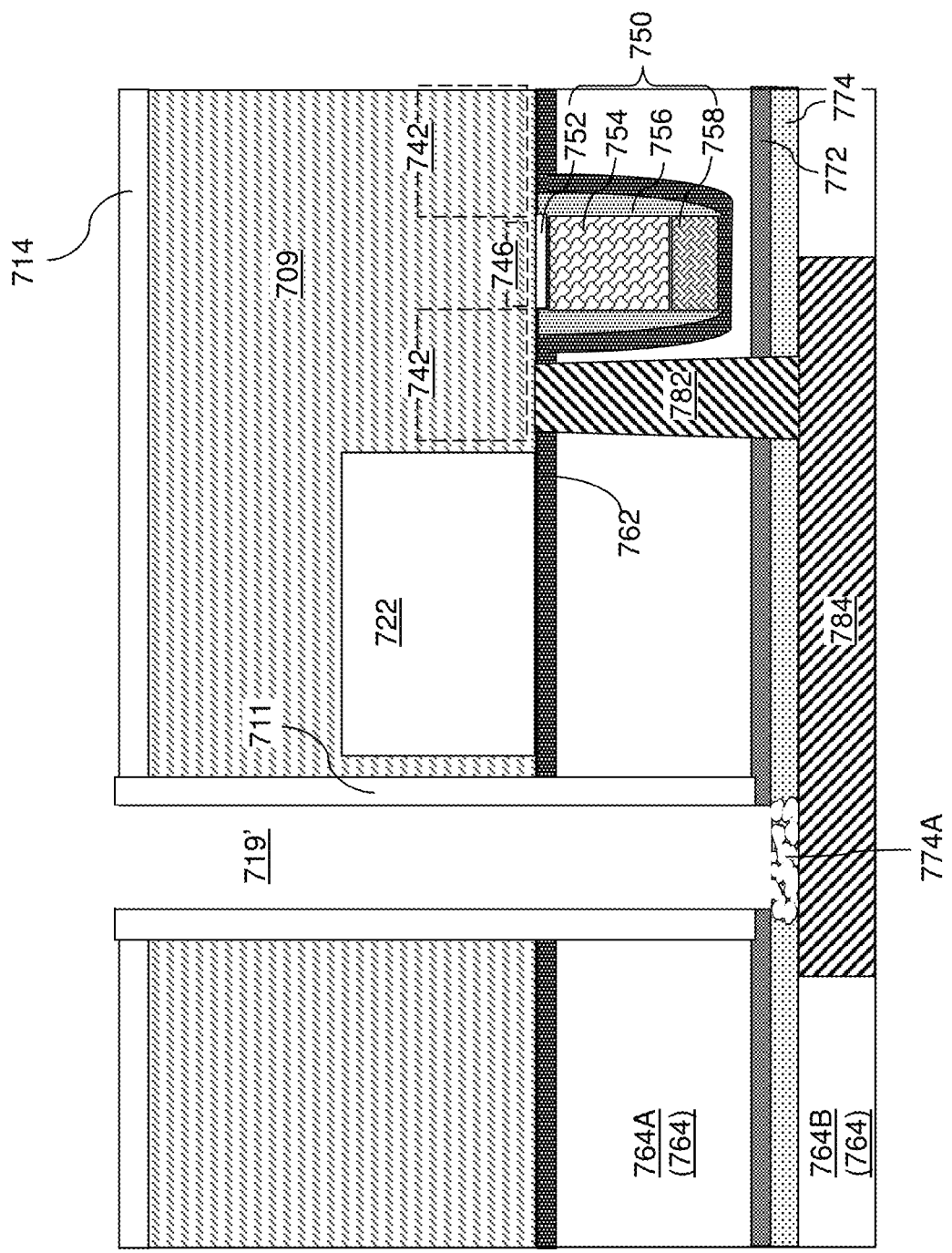
FIG. 12 is a vertical cross-sectional view of a region of the support die of the bonded assembly after vertically extending a via cavity through an etch stop dielectric layer according to an embodiment of the present disclosure.

Referring to FIG. 12, an optional anisotropic etch process may be performed, which etches through portions of the etch stop dielectric layer 772 (if present) that underlie the in-process via cavities 719". Each in-process via cavity 719" may be vertically extended by the anisotropic etch process through the underlying portions of the etch stop dielectric layer 772 to provide a via cavity 719'. If the etch stop dielectric layer 772 is not present in the in-process via cavities 719", then the optional anisotropic etch process may be omitted. A proximal surface of the porous dielectric material layer 774 may be physically exposed at the bottom of each via cavity 719' either after the optional anisotropic etch process or during formation of the tubular dielectric spacer 711 if the optional anisotropic etch process is omitted. As used herein, a proximal surface refers to a surface that is proximal to an adjacent substrate, and a distal surface refers to a surface that is distal from the adjacent substrate. In an embodiment, the proximal surface of the porous dielectric material layer 774 refers to a planar horizontal surface that is proximal to the substrate semiconductor layer 709 and contacts the etch stop dielectric layer 772 or the first dielectric material layer 764A, and the distal surface of the porous dielectric material layer 774 refers to a planar horizontal surface that is distal from the substrate semiconductor layer 709 and contacts the second dielectric material layer 764B.

In one embodiment, each via cavity 719' may vertically extend through the first semiconductor substrate (such as the substrate semiconductor layer 709) and the first dielectric material layer 764A, and may stop on a proximal surface of the porous dielectric material layer 774. A continuous network of pores 774A that are free of any solid material therein continuously extends from the bottom of the via cavity 719' to a surface of an underlying metal interconnect structure (such as a conductive line structure 784). As discussed above, a continuous network of pores 774A and a continuous network of a dielectric matrix complementarily may occupy at least 95% of the entire volume of the porous dielectric material with less than 5% of the volume of the porous dielectric material being occupied with isolated pores. The continuous network of the dielectric matrix is physically exposed at the bottom of each via cavity 719'.

According to an embodiment of the present disclosure, a proximal surface of the underlying metal interconnect structure (such as the conductive line structure 784) is physically exposed through the continuous network of pores 774A in the continuous network of the dielectric matrix of the porous dielectric material layer 774. As such, a predominant portion (which is more than 50%, and may be more than 90%), of the physically exposed surface are of the conductive line structure 784 is shielded from the plasma of the anisotropic etch process used to etch through the etch stop dielectric material layer 772 and/or through a bottom portion of the conformal dielectric layer that is used to form the tubular dielectric spacers 711 by the continuous network of the dielectric matrix. Further, sputtering of the metallic material of the conductive line structures 784 on the sidewalls of the tubular dielectric spacer 711 may be minimized due to the presence of the continuous network of the dielectric matrix of the porous dielectric material layer 774.

Figure 13A:
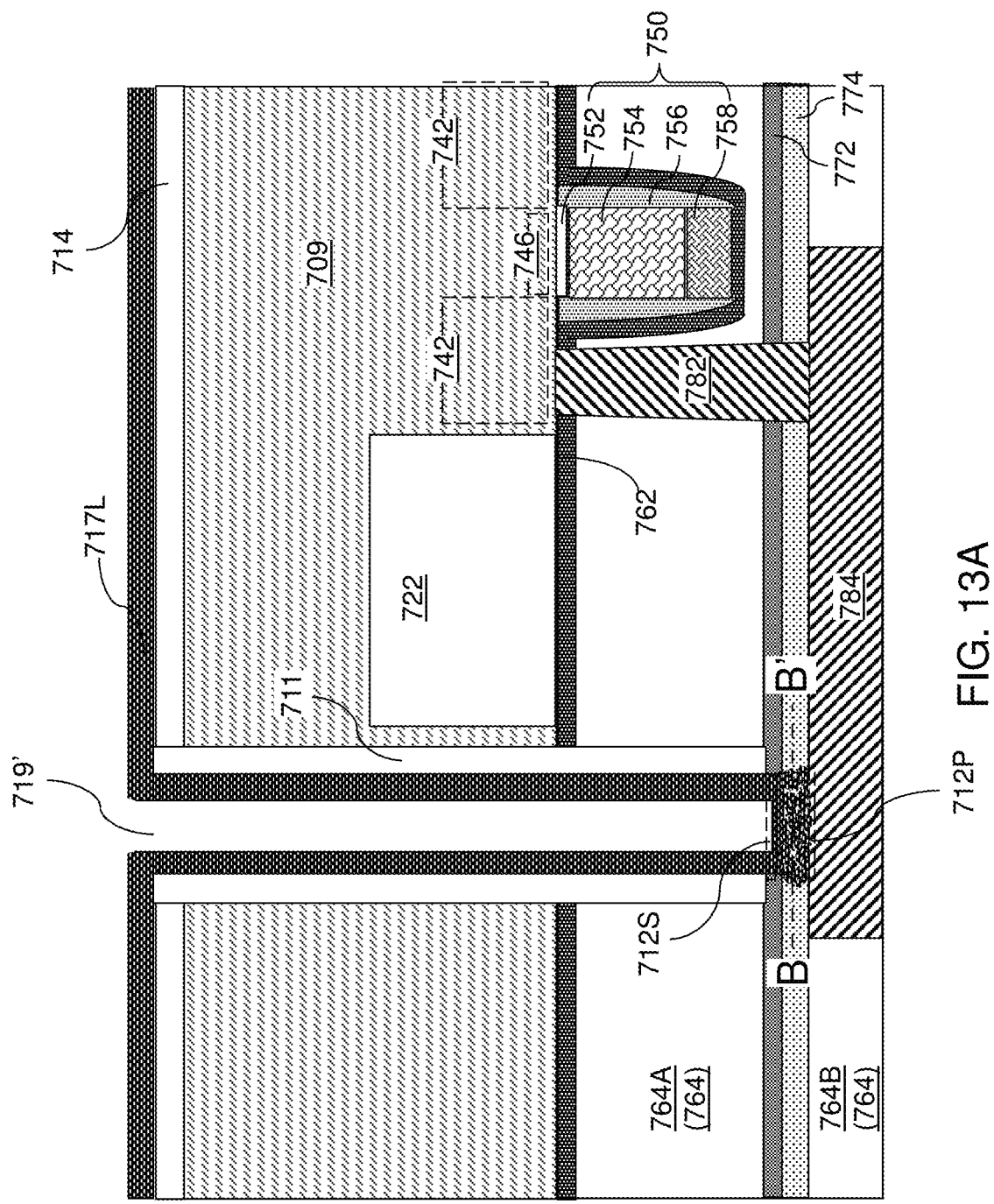
FIG. 13A is a vertical cross-sectional view of a region of the support die of the bonded assembly after deposition of a metallic liner according to an embodiment of the present disclosure.
Figure 13B:
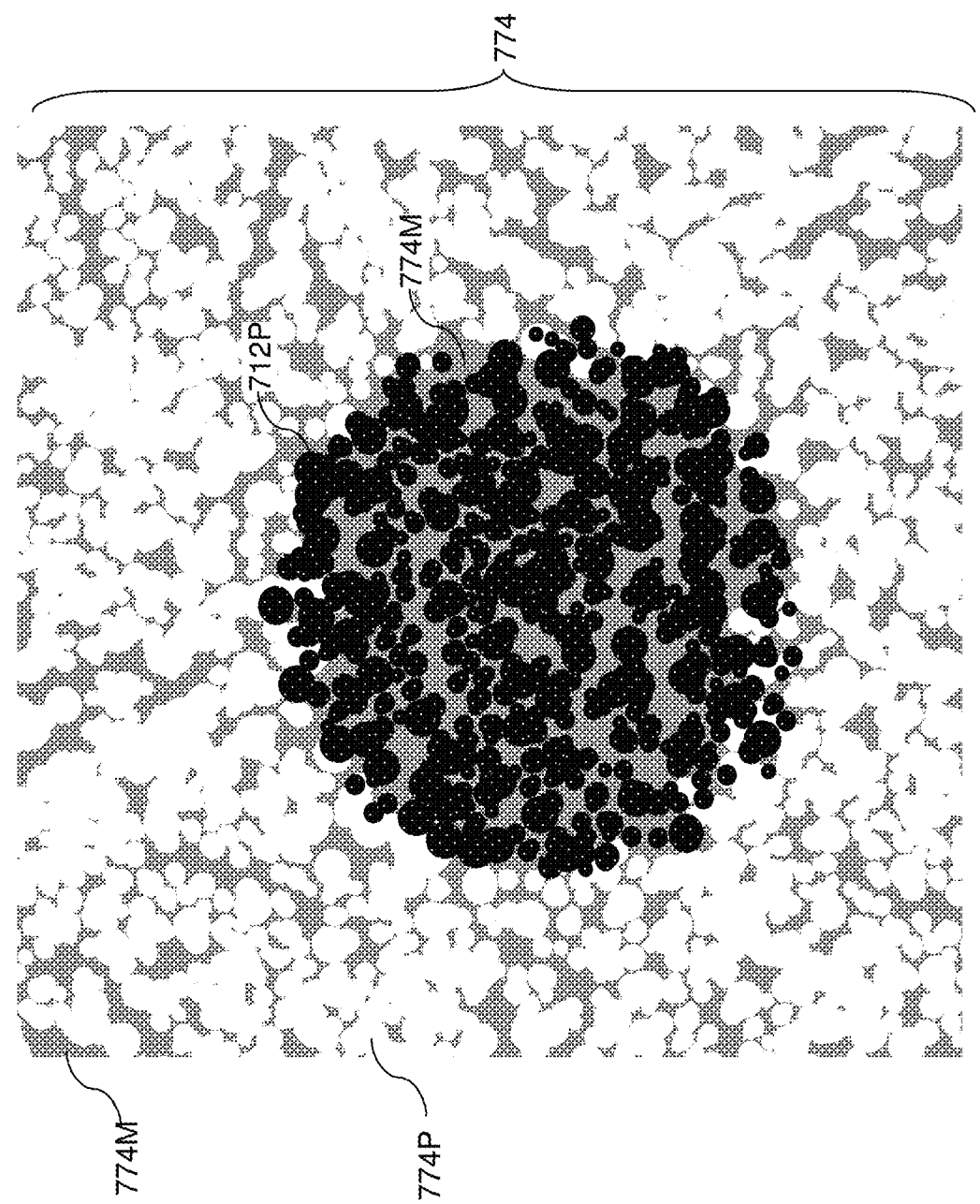
FIG. 13B is a horizontal cross-sectional view of a portion of the structure of FIG. 13A along the horizontal plane B-B' of FIG. 13A.

Referring to FIGS. 13A and 13B, a metallic material may be deposited by a conformal deposition process in the volumes of the pores 774A underlying the via cavities 719', on the inner sidewalls of the tubular dielectric spacers 711, and over the top surface of the backside insulating layer 714. The metallic material may include at least one conductive metallic nitride material such as TiN, TaN, and/or WN. In one embodiment, the metallic material may be deposited by a conformal deposition process such as chemical vapor deposition, atomic layer deposition, electroplating, and/or electroless plating. An anisotropic deposition process such as physical vapor deposition may be used in addition to, or in lieu of, the conformal deposition process. The deposited metallic material forms a metallic liner layer 717L, which may have a thickness that is greater than the thickness of the porous dielectric material layer 774.

The metallic liner layer 717L may include porous metallic material portions 712P that fill a respective portion of the continuous network of pores within the porous dielectric material layer 774. Each porous metallic material portion 712P may underlie a respective via cavity 719', and may include a metallic material having a porosity in a range from 20% to 80%. As shown in FIG. 13B, unfilled pores 774P in the continuous network of pores 774A within the porous dielectric material layer 774 may also remain. The metallic liner layer 717L may include solid metallic material portions 712S that comprises the same metallic material as the porous metallic material portions 712P. Each solid metallic material portion 712S may be adjoined to, and directly overlies, an underlying porous metallic material portion 712P. Each porous metallic material portion 712P may comprise a continuous network of percolating metallic particles formed within the pores 774P a continuous porous dielectric matrix 774M of the porous dielectric material layer 774. A combination of a continuous network of percolating metallic particles and the porous dielectric matrix complementarily fill at least 95% of a volume between the solid metallic material portion 712S and the metal interconnect structure (such as the conductive line structure 784).

Figure 14A:
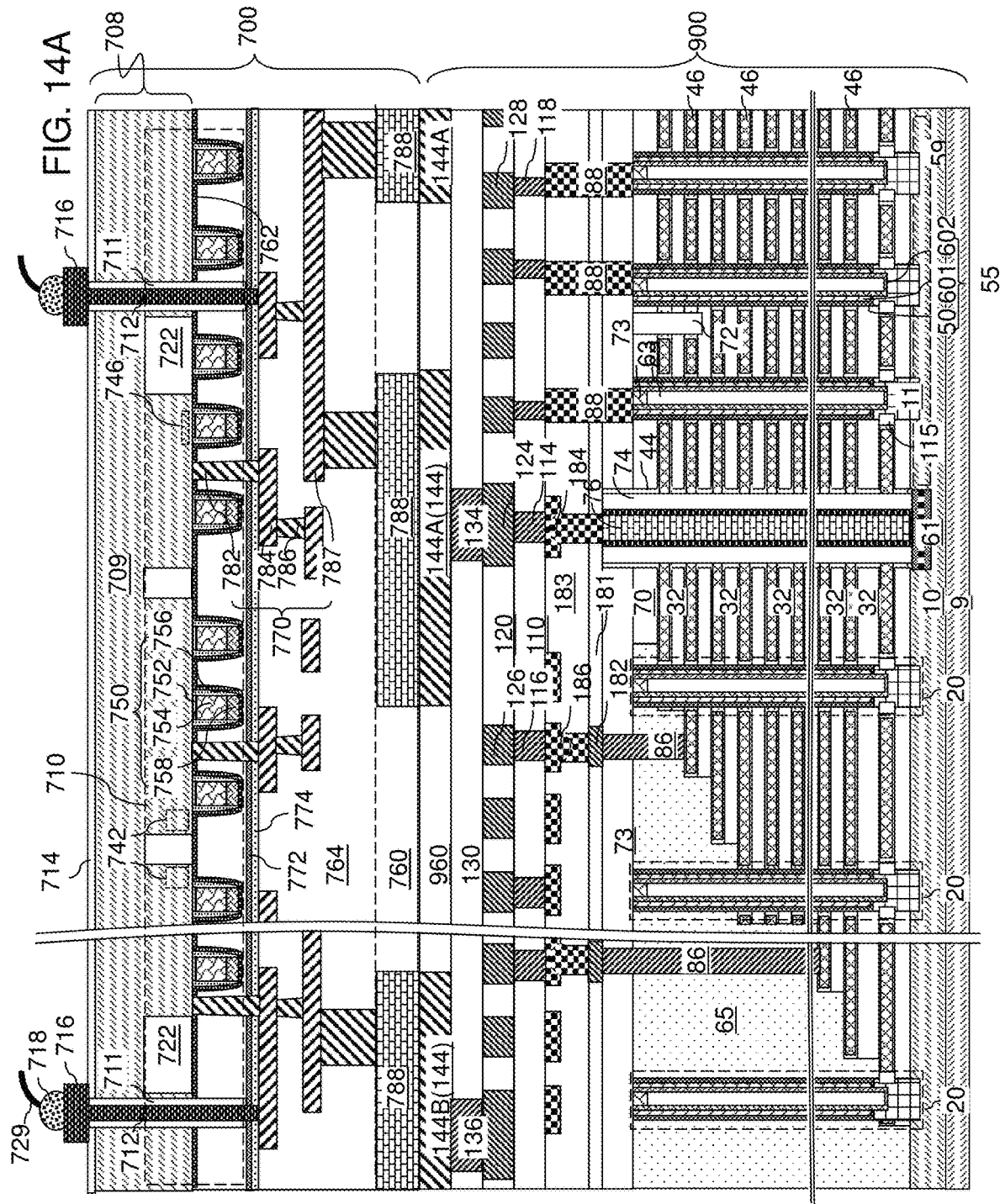
FIG. 14A is a vertical cross-sectional view of the support die of the bonded assembly after formation of through-substrate contact via structures according to an embodiment of the present disclosure.
Figure 14B:
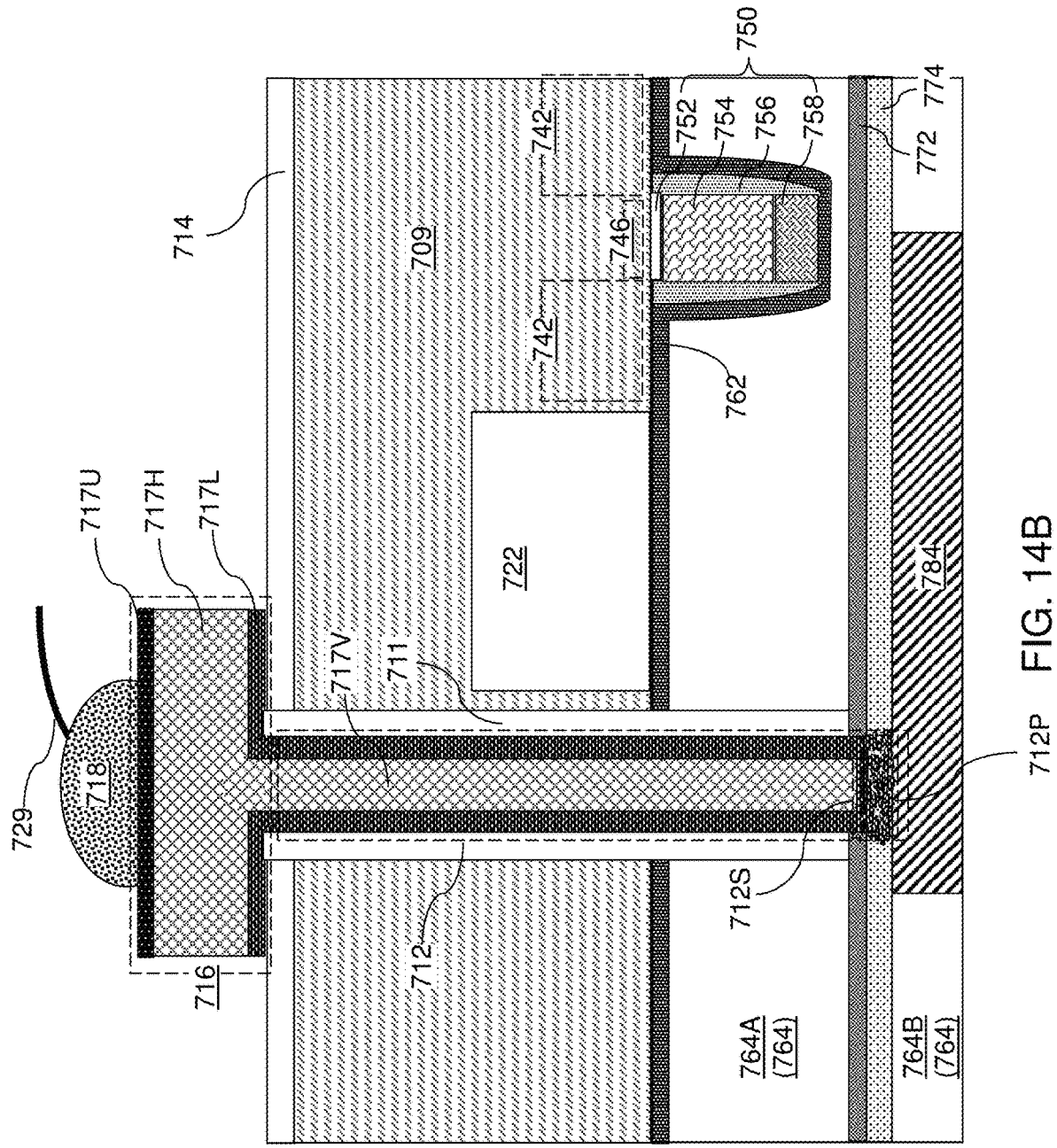
FIG. 14B is a vertical cross-sectional view of a region of the support die of the bonded assembly of FIG. 14A.

Referring to FIGS. 14A and 14B, at least one metal fill material such as W, Cu, Co, Ru, and/or Mo may be deposited in remaining volumes of the via cavities 719' and over the backside insulating layer 714. An underbump metallurgy (UBM) stack may be deposited over a top surface of the at least one metal fill material. The UBM stack and portions of the at least one metal fill material that overlie the top surface of the backside insulating layer 714 may be patterned by a combination of lithographic methods and an etch process to pattern discrete conductive structures (712, 716). Each discrete conductive via structure (712, 716) may include a vertical stack of a through-substrate via structure 712 and an external bonding pad 716.

Each through-substrate via structure 712 may include a portion of a metallic liner layer 717L that extends from the interface between the backside insulating layer 714 and a metal interconnect structure such as a conductive line structure 784, and a vertically-extending metal portion 717V that is laterally surrounded by the portion of a metallic liner layer 717L. Each external bonding pad 716 includes a horizontal portion of the metallic liner layer 717L, a horizontally-extending metal portion 717H, and a UBM stack 717U. The horizontal portion of the metallic liner layer 717L is more distal from the substrate semiconductor layer 709 than the backside insulating layer 714 is from the substrate semiconductor layer 709. The horizontally-extending metal portion 717H may have the same material composition as the vertically-extending metal portion 717V. Each external bonding pad 716 contacts a respective through-substrate via structure 712, and is located over the backside surface of the first semiconductor substrate layer (such as the substrate semiconductor layer 709). Subsequently, a solder ball 718 may be bonded to each external bonding pad 716, and a bonding wire 729 may be attached to each solder ball 718.

Figure 15:
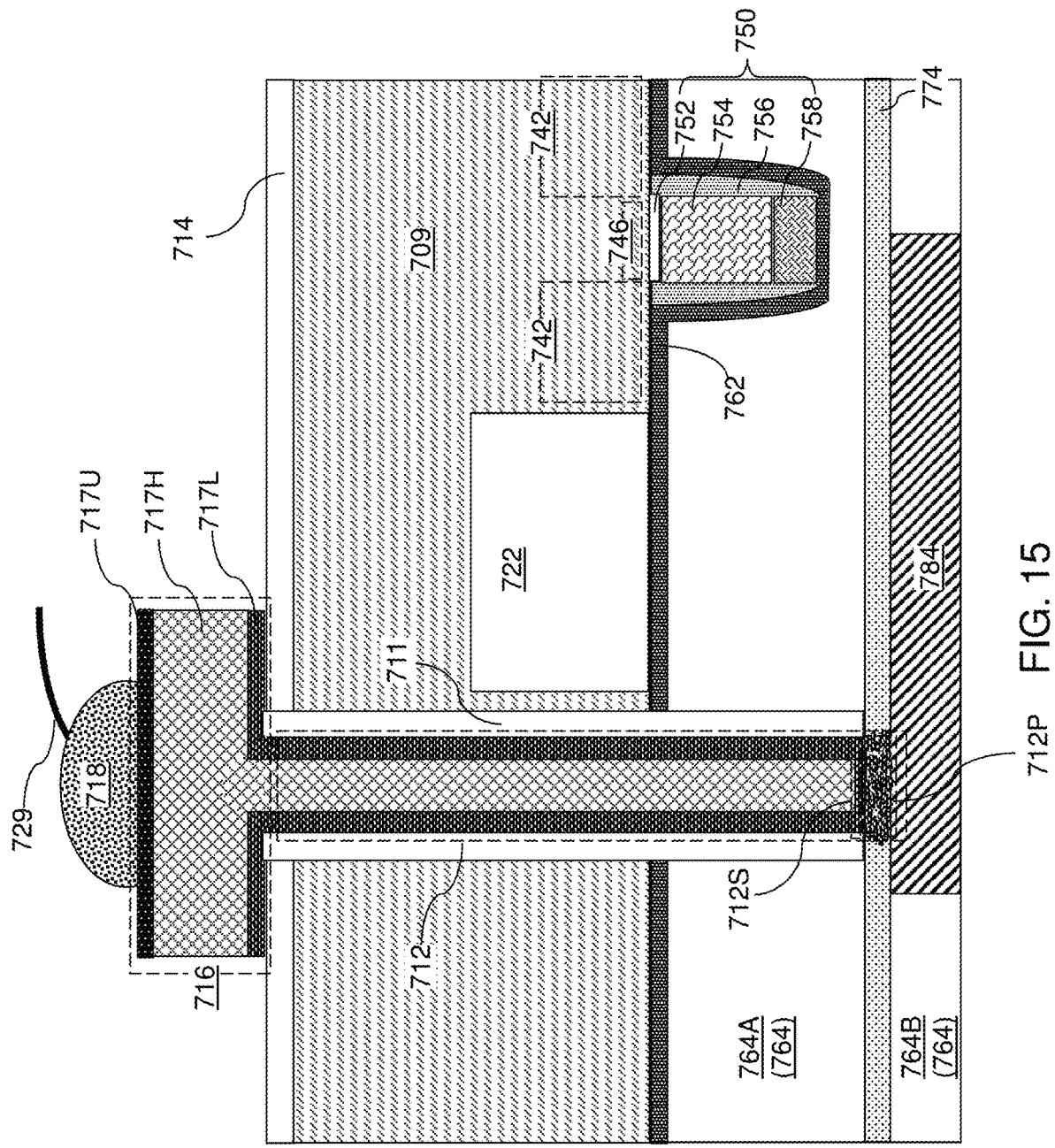
FIG. 15 is a vertical cross-sectional view of a region of an alternative configuration of the support die of the bonded assembly of FIG. 14A.

Referring to FIG. 15, an alternative configuration of the support die of the bonded assembly is illustrated, which is a configuration in which the optional etch stop dielectric layer 772 is omitted.

Referring to all drawings and according to various embodiments of the present disclosure, a semiconductor structure comprising a first semiconductor die (such as a support die 700) is provided. The first semiconductor die comprises: a first semiconductor substrate 708 having a front-side surface and a backside surface; first semiconductor devices 710 located on the front-side surface of the first semiconductor substrate; a first dielectric material layer 764A located on the first semiconductor devices 710 and having formed therein conductive via structures 782 contacting nodes of the first semiconductor devices 710; a second dielectric material layer 764B located on the first dielectric material layer 764A, more distal from the first semiconductor substrate 708 than the first dielectric material layer 764A is from the first semiconductor substrate 708, a metal interconnect structure (such as a conductive line structure 784) that is not in direct contact with the first semiconductor substrate 708 located in the second dielectric material layer 746B; and a through-substrate via structure 712 extending from a backside surface of the first semiconductor substrate to a proximal surface of the metal interconnect structure, wherein a horizontal portion of the through-substrate via structure 712 that contacts the proximal surface of the metal interconnect structure comprises a porous metallic material portion 712P having a porosity in a range from 20% to 80%.

In one embodiment, a porous dielectric material layer 774 may be located between the first dielectric material layer 764A and the second dielectric material layer 764B, and may laterally surround the horizontal portion of the through-substrate via structure 712. In one embodiment, the porous dielectric material layer 774 may have a porosity in a range from 20% to 80%.

In one embodiment, the porous dielectric material layer 774 comprises a continuous network of pores 774A that extends from a proximal horizontal surface of the porous dielectric material layer 774 to a distal horizontal surface of the porous dielectric material layer 774. In one embodiment, the porous metallic material portion 712P may be formed within a continuous network of pores 774A within the porous dielectric material layer 774. In one embodiment, a solid metallic material portion 712S that comprises the same metallic material as the porous metallic material portion 712P may be adjoined to the porous metallic material portion 712P.

In one embodiment, the porous metallic material portion 712P comprises a continuous network of percolating metallic particles formed within a continuous porous dielectric matrix. A combination of the continuous network of percolating metallic particles and the continuous porous dielectric matrix complementarily fill at least 95% of the volume between the solid metallic material portion 712S and the metal interconnect structure (such as a conductive line structure 784). In one embodiment, the same metallic material comprises, and/or consists of, at least one material selected from TiN, TaN, and WN.

In one embodiment, the porous dielectric material layer 774 comprises, and/or consists of, a porous organosilicate glass and has a thickness in a range from 6 nm to 60 nm. In one embodiment, the semiconductor structure may comprise: a via opening 719 extending through the first semiconductor substrate 708 (such as through the substrate semiconductor layer 709) and the first dielectric material layer 764A with a straight sidewall; and a tubular dielectric spacer 711 located on the straight sidewall of the via opening 719, wherein the through-substrate via structure 712 extends through, and contacts an inner sidewall of, the tubular dielectric spacer 711. In one embodiment, an annular end surface of the tubular dielectric spacer 711 is vertically spaced from the metal interconnect structure (such as the conductive line structure 784) at least by a thickness of the porous dielectric material layer 774.

In one embodiment, the semiconductor structure comprises: an external bonding pad 716 contacting the through-substrate via structure 712 and located over the backside surface of the first semiconductor substrate 708; a solder ball 718 bonded to the external bonding pad 716; and a bonding wire 729 attached to the solder ball 718.

In one embodiment, the semiconductor structure may comprise a second semiconductor die (such as a memory die 900) bonded to the first semiconductor die via die-to-die bonding. The front-side surface of the first semiconductor substrate may be more proximal to the second semiconductor die than the backside surface is to the second semiconductor die. In one embodiment, the second semiconductor die comprises a memory die 900 comprising a three-dimensional array of memory elements therein; and the first semiconductor devices in the first semiconductor die comprises a peripheral circuitry configured to control operation of the three-dimensional array of memory elements.

The various embodiments of the present disclosure may be used to reduce plasma damage to the semiconductor devices 710 on a first semiconductor substrate 708 by covering a predominant portion of the surfaces of metal interconnect structures (such as the conductive line structures 784) with a porous dielectric matrix of the porous dielectric material layer 774 during an anisotropic etch process that physically exposes proximal surfaces of the metal interconnect structures. During an etching step, energetic ions may travel through the pores of the porous dielectric matrix of the porous dielectric material layer 774 and release the ion energy at the pore surface. Thus, the underlying surface and semiconductor devices 710 connected by metal interconnection 784 may be protected from damage. Further, the porous dielectric matrix may reduce sputtering of the metallic material of the metal interconnect structures on sidewalls of the tubular dielectric spacers 711. The reliability of electrical contact for the through-substrate via structures 712 may be enhanced. Simulations indicate that the level of increase in the resistance of the through-substrate via structure 712 due to the porous metallic material portions 712P may be at a manageable level such as about, or less than, 1% of the total resistance of an electrically conductive paths including the through-substrate via structures 712. Thus, increase in the electrical resistance of the electrically conductive path is not a barrier to implementation of the structure of the through-substrate via structure 712 of the present disclosure. In addition, no extra processing steps may be needed to form the through via structures.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a first semiconductor die, wherein the first semiconductor die comprises:
    a first semiconductor substrate having a front-side surface and a backside surface;
 first semiconductor devices located on the front-side surface of the first semiconductor substrate;
    a first dielectric material layer located on the first semiconductor devices and having formed therein conductive via structures contacting nodes of the first semiconductor devices;
    a second dielectric material layer located on the first dielectric material layer, wherein the second dielectric material layer is more distal from the first semiconductor substrate than the first dielectric material layer is from the first semiconductor substrate;
    a metal interconnect structure that is not in direct contact with the first semiconductor substrate located in the second dielectric material layer; and
    a through-substrate via structure extending from a backside surface of the first semiconductor substrate to a proximal surface of the metal interconnect structure, wherein a horizontal portion of the through-substrate via structure that contacts the proximal surface of the metal interconnect structure comprises a porous metallic material portion having a porosity in a range from 20% to 80%.

2. The semiconductor structure of claim 1, further comprising a porous dielectric material layer located between the first dielectric material layer and the second dielectric material layer and laterally surrounding the horizontal portion of the through-substrate via structure.

3. The semiconductor structure of claim 2, wherein the porous dielectric material layer has a porosity in a range from 20% to 80%.

4. The semiconductor structure of claim 2, wherein the porous dielectric material layer comprises a continuous network of pores that extends from a proximal horizontal surface of the porous dielectric material layer to a distal horizontal surface of the porous dielectric material layer.

5. The semiconductor structure of claim 4, wherein the porous metallic material portion is formed within the continuous network of pores within the porous dielectric material layer.

6. The semiconductor structure of claim 2, further comprising a solid metallic material portion that comprises a same metallic material as the porous metallic material portion and is adjoined to the porous metallic material portion.

7. The semiconductor structure of claim 6, wherein the porous metallic material portion comprises a continuous network of percolating metallic particles formed within a continuous porous dielectric matrix, wherein a combination of the continuous network of percolating metallic particles and the continuous porous dielectric matrix complementarily fill at least 95% of a volume between the solid metallic material portion and the metal interconnect structure.

8. The semiconductor structure of claim 6, wherein the same metallic material comprises at least one material selected from TiN, TaN, and WN.

9. The semiconductor structure of claim 2, wherein the porous dielectric material layer comprises a porous organosilicate glass and has a thickness in a range from 6 nm to 60 nm.

10. The semiconductor structure of claim 2, further comprising:
    a via opening extending through the first semiconductor substrate and the first dielectric material layer with a straight sidewall; and
    a tubular dielectric spacer located on the straight sidewall of the via opening, wherein the through-substrate via structure extends through, and contacts an inner sidewall of, the tubular dielectric spacer.

11. The semiconductor structure of claim 10, wherein an annular end surface of the tubular dielectric spacer is vertically spaced from the metal interconnect structure at least by a thickness of the porous dielectric material layer.

12. The semiconductor structure of claim 1, further comprising:
    an external bonding pad contacting the through-substrate via structure and located over the backside surface of the first semiconductor substrate;
    a solder ball bonded to the external bonding pad; and
    a bonding wire attached to the solder ball.

13. The semiconductor structure of claim 1, further comprising a second semiconductor die bonded to the first semiconductor die via die-to-die bonding, wherein the front-side surface of the first semiconductor substrate is more proximal to the second semiconductor die than the backside surface is to the second semiconductor die.

14. The semiconductor structure of claim 13, wherein:
    the second semiconductor die comprises a memory die comprising a three-dimensional array of memory elements therein; and
    the first semiconductor devices in the first semiconductor die comprises a peripheral circuitry configured to control operation of the three-dimensional array of memory elements.

* * * * *